United States Patent
Inoue et al.

(10) Patent No.: US 7,866,037 B2
(45) Date of Patent: Jan. 11, 2011

(54) METALLIZATION FORMING METHOD

(75) Inventors: Seiichi Inoue, Kanagawa (JP); Akira Ichiki, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 30 days.

(21) Appl. No.: 12/382,239

(22) Filed: Mar. 11, 2009

(65) Prior Publication Data
US 2009/0241334 A1   Oct. 1, 2009

(30) Foreign Application Priority Data
Mar. 27, 2008   (JP) .............................. 2008-084019

(51) Int. Cl.
*H05K 3/10* (2006.01)
(52) U.S. Cl. .......................... 29/846; 29/825; 430/259; 430/260; 430/262
(58) Field of Classification Search ................... 29/825, 29/846; 430/259, 260, 262
See application file for complete search history.

(56) References Cited

U.S. PATENT DOCUMENTS

| | | | | |
|---|---|---|---|---|
| 2,326,058 A | * | 8/1943 | Nadeau | 430/259 |
| 2,527,263 A | * | 10/1950 | Hart | 430/259 |
| 2,925,340 A | * | 2/1960 | Bryce et al. | 430/259 |
| 3,453,111 A | * | 7/1969 | Yackel | 430/262 |
| 4,599,295 A | * | 7/1986 | Kondo et al. | 430/156 |
| 4,666,818 A | * | 5/1987 | Lake et al. | 430/256 |
| 5,015,553 A | * | 5/1991 | Grandmont et al. | 430/260 |
| 5,254,435 A | * | 10/1993 | Grandmont et al. | 430/260 |
| 2007/0269675 A1 | * | 11/2007 | Ichiki et al. | 428/603 |

FOREIGN PATENT DOCUMENTS

| | | |
|---|---|---|
| JP | 2006-352073 | 12/2006 |
| JP | 2008-352073 | * 12/2006 |
| JP | 2007-129205 | 5/2007 |

* cited by examiner

*Primary Examiner*—C. J Arbes
(74) *Attorney, Agent, or Firm*—Joel C. Edwards, Esq.; Akerman Senterfitt LLP

(57) ABSTRACT

A metallization forming method comprises the steps of: patterning a silver halide emulsion on a surface of at least one side of a substrate in accordance with a desired metallization pattern to form a patterned emulsion layer; exposing the patterned emulsion layer; and thereafter developing the exposed patterned emulsion layer to form a patterned conductive silver layer having the metallization pattern.

10 Claims, 6 Drawing Sheets

FIG. 6
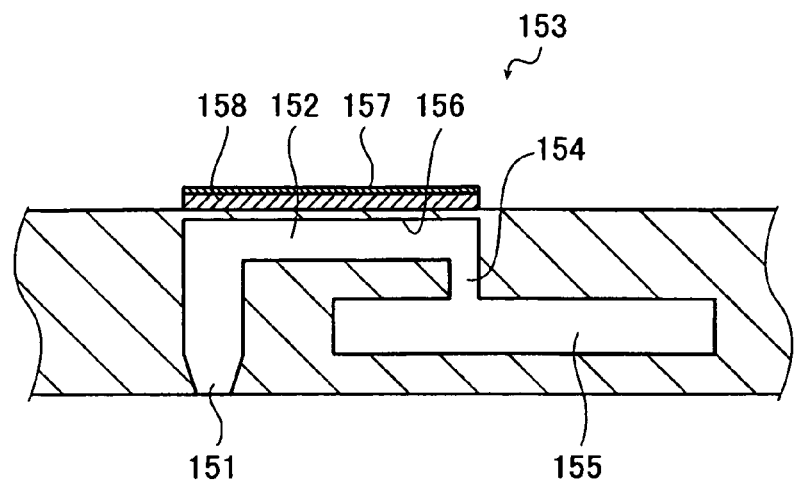
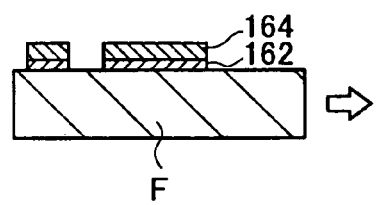
FIG. 7A
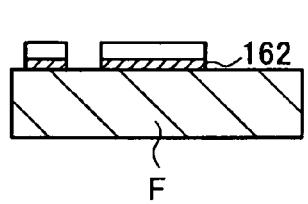
FIG. 7B
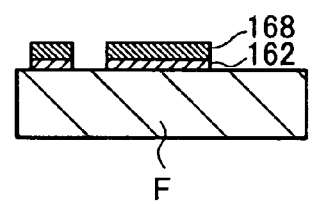
FIG. 7C
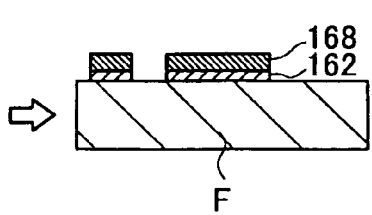
FIG. 7D
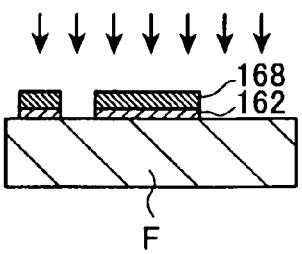
FIG. 7E
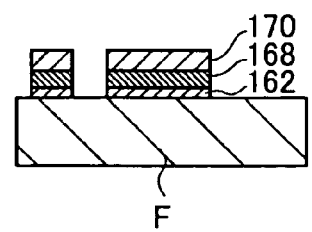
FIG. 7F

METALLIZATION FORMING METHOD

CROSS-REFERENCE TO RELATED APPLICATIONS

The present application claims priority from Japanese Patent Application No. 2008-084019, filed Mar. 27, 2008, the contents of which are herein incorporated by reference in their entirety.

BACKGROUND OF THE INVENTION

The present invention relates to a metallization forming method, more particularly, to a method of forming metallization on printed circuit boards.

Conventionally, the pattern on the metallized part (conductor part) of printed circuit boards (electronic circuit boards) has been formed by two major processes, the subtractive and the additive (semi-additive).

In the subtractive process, the unwanted part of a metal layer on a substrate is removed but the necessary part is left intact to form a metallization pattern (conductor part); in contrast, the additive process involves forming a metallization pattern on a substrate.

In either process, the photolithographic technology has heretofore been employed. In the additive process, metal is reductively precipitated on a surface of a substrate by, for example, electroless plating via a mask so as to form a metallization pattern and the photolithographic technology is used to form the pattern of the mask.

In the subtractive process, a photoresist (a light-sensitive resin) such as a dry film resist or a liquid resist applied to the surface of a copper-clad laminate having an insulating layer and a copper foil as a conductor metal is irradiated with an electromagnetic radiation such as UV light or excimer laser via a photomask having a circuit or other pattern formed thereon and, then, the mask pattern is exposed (transferred) and developed to form a resist pattern.

After thus forming the resist pattern by the photolithographic technology, the copper foil not covered with the photoresist is removed by etching to form a desired metallization pattern.

The above-described method of forming the desired metallization pattern using the resist pattern formed by the photolithographic technology takes time to prepare the photomask and in addition to the etching step for removing the unwanted part of the conductor metal, the step of exposing and developing the resist is required to form the resist pattern. Hence, it takes time and cost to form the metallization pattern.

As another approach, it has recently been proposed to form the pattern of the metallized part (conductor part) of a printed wiring board (electronic circuit board) by using a conductive fine particle dispersed ink system. In the conductive fine particle dispersed ink drawing system, the ink-jet printing process is used to form a desired metallization pattern by directly patterning a conductive, fine particulate material on the substrate in accordance with the metallization pattern.

Since this conductive fine particle dispersed ink drawing system has no need to prepare a mask, it involves fewer steps than the method of forming a desired metallization pattern by applying the photolithographic technology to form a resist pattern.

However, to ensure that the fine particulate material manifests its conductivity, baking must be performed under elevated temperatures for a prolonged period of time; this not only limits the type of substrates (substrate materials) on which a metallization pattern can be formed but it also increases the running cost and the size of the apparatus for performing the baking step.

As alternatives to these methods, it has most recently been proposed that a desired metallization pattern be formed by performing exposure and development processing on the light-sensitive material.

For example, JP 2006-352073 A discloses a method in which a light-sensitive material having a silver salt containing layer on the entire surface of a substrate (support) is exposed using a laser beam based scan exposure system and a photomask and the material is then developed to form a conductive pattern on the substrate, followed by plating the conductive pattern so that it becomes conductive to thereby form a metallization pattern.

JP 2007-129205 A discloses a method in which a light-sensitive material having a silver salt emulsion containing emulsion layer formed on the entire surface of a substrate (support) is exposed using a laser beam based scan exposure system and a photomask and the material is then developed to form metallic silver on the substrate, followed by smoothing the metallic silver to form a metallization pattern.

The metallization pattern forming methods that are disclosed in the two patent documents are described below by referring to FIGS. 10A through 10F, which illustrate the conventional method of forming a metallization pattern.

First, a subbing coat 202 is formed on the entire surface of a substrate S and an emulsion having a silver halide to gelatin ratio of 2:1 by volume is applied to the entire surface of the substrate S to form an emulsion layer 204 (see FIG. 10A).

Then, the emulsion layer 204 is exposed by an analog exposing method via a mask 208 to print the pattern of the mask 208 on the emulsion layer 204 (see FIG. 10B). Instead of the mask 208, a laser exposure direct drawing method may be employed to expose the emulsion layer 204 so that the pattern of the mask 208 is printed on the emulsion layer 204.

The emulsion layer 204 having the pattern of the mask 208 printed on it is developed to generate conductive silver 212 (see FIG. 10C). Since the silver halide is also present in the unexposed areas 214 of the emulsion layer 204, fog, the adhesion of the silver in the developer and other troubles may occur on account of the pressure applied to the emulsion layer 204 or the static electricity generated during the transport of the substrate S, occasionally causing metallic silver (black pepper) 216 to appear in unexposed areas 214.

Accordingly, in order to remove the silver halide from the unexposed areas 214 and stabilize them, fixing, acid washing, the addition of a pressure fog preventing agent, an antistatic agent or the like, and other treatments are performed, followed by washing with water and drying (see FIG. 10D).

Subsequently, in order to increase its conductivity, the conductive silver (metallization pattern) 212 is subjected to smoothing (compacting) such as calendering (see FIG. 10E).

To render the conductive silver 212 even more conductive, plating is performed to form conductive metal parts 218 on top of the conductive silver 212 (see FIG. 10F).

This is the recent method in which a light-sensitive material is applied to the entire surface of a substrate, a mask pattern is printed, and exposure and development processing is performed to form a desired metallization pattern.

SUMMARY OF THE INVENTION

Compared to the method of forming a resist pattern and a desired metallization pattern by the photolithographic technology, the metallization pattern forming methods disclosed in JP 2006-352073 A and JP 2007-129205 A involve no step of forming a resist pattern and, what is more, if the laser exposure direct drawing method is employed in the exposing step as illustrated in FIG. 10B, the need to use the mask 208 is also eliminated, which in turn eliminates the mask preparing step; this contributes to increasing the flexibility to meet the on-demand requirement.

Compared to the method of forming a metallization pattern by the conductive fine particle dispersed ink drawing process, the metallization pattern forming methods disclosed in JP 2006-352073 A and JP 2007-129205 A have no need to perform the baking step for manifesting the conductivity of the fine particulate material and can, hence, be applied to substrates of low heat resistance such as general-purpose resin films.

However, the problem with the metallization pattern forming methods disclosed in JP 2006-352073 A and JP 2007-129205 A is that the substrate on which a metallization pattern can be formed is limited to those which have a silver halide containing emulsion layer formed on the entire surface, so that the methods are not applicable to commercially available wiring boards and like substrates such as for flat panel detectors (FPDs). As a result, the scope of applicability of those methods becomes very narrow.

As a further problem, if the mask 208 is used in the metallization pattern forming methods disclosed in JP 2006-352073 A and JP 2007-129205 A (see FIG. 10B), it takes considerable cost to prepare and this impairs the flexibility to meet the on-demand requirement, often with the result that the methods are difficult to apply in small-lot or short-term production.

If desired, instead of using the mask 208 in the metallization pattern forming methods disclosed in JP 2006-352073 A and JP 2007-129205 A, a laser exposing apparatus may be used to perform optical patterning by laser exposure; since there is no need to use the mask 208, the cost of mask preparation is saved and the flexibility to meet the on-demand requirement is provided, but then because of the need to perform sequential exposure to form a pattern, the exposure step takes such a long time that it is difficult to improve the production rate.

What is more, there arises a need to increase the sensitivity of light-sensitive materials such as silver halides; however, it is not only difficult to choose suitable sensitizing dyes for this purpose but, at the same time, it becomes necessary to perform a chemical sensitizing treatment depending on the need.

Further in addition, a laser exposing apparatus of a higher definition is so expensive that it takes considerable costs to form a metallization pattern.

Whichever method of exposure is used, the patterning of an emulsion layer is accomplished by exposure, so given a transparent substrate such as one that is made of polyimide, polyethylene terephthalate, polyethylene naphthalate or triacetyl cellulose, the pattering light simply passes through the thickness of the substrate during exposure; hence, the metallization pattern forming methods disclosed in JP 2006-352073 A and JP 2007-129205 A are incapable of forming a metallization pattern on both sides of the substrate. This makes it difficult to use those methods in practical applications.

It should also be noted that the metallization pattern formed by either of the methods disclosed in JP 2006-352073 A and JP 2007-129205 A has the residual silver halide in the unexposed areas 214, so particularly in the case of forming a fine-line metallization, a pressure applied to unexposed areas 214 may potentially cause them to be sensitized or static fog might occur during transport (see above), often resulting in the generation of black pepper 216 in unexposed areas 214 (see FIG. 10C). In order to solve this problem, the metallization pattern forming methods disclosed in JP 2006-352073 A and JP 2007-129205 A require special treatments such as fixing, acid washing, and the addition of a pressure fog preventing agent, an antistatic agent or the like, as illustrated in FIG. 10D.

As yet another problem, the metallization patterns formed by the methods disclosed in JP 2006-352073 A and JP 2007-129205 A have residual gelatin in unexposed areas 214, which gelatin may occasionally absorb moisture and lower the withstand voltage of the metallization patterns or otherwise deteriorate the reliability of the insulation (e.g., resistance to migration).

What is more, the gelatin portion is highly likely to yellow with time. The yellowing of the gelatin portion is particularly harmful in the case where those methods are employed to form a transparent wiring board since it might adversely affect the optical characteristics of the board.

A further problem with the metallization pattern forming methods disclosed in JP 2006-352073 A and JP 2007-129205 A is that it is difficult to reduce the running cost since silver which is a very expensive material is used not only in the metallization pattern but also in the unexposed areas 214.

In addition, the metallization pattern forming methods disclosed in JP 2006-352073 A and JP 2007-129205 A which perform optical patterning require a darkroom to apply the exposing and developing process.

It is therefore an object of the present invention to solve the aforementioned problems of the prior art by providing a metallization forming method that can be performed on a great variety of substrates to form a highly conductive and high-quality metallization pattern at lower cost.

A metallization forming method according to the invention comprises the steps of: patterning a silver halide emulsion on a surface of at least one side of a substrate in accordance with a desired metallization pattern to form a patterned emulsion layer; exposing the patterned emulsion layer; and thereafter developing the exposed patterned emulsion layer to form a patterned conductive silver layer having the metallization pattern.

BRIEF DESCRIPTION OF THE DRAWINGS

FIG. 6 is a sectional view showing a structure of a single liquid ejecting element.

FIGS. 7A through 7F show an example of the metallization forming method of the present invention in a stepwise manner.

DETAILED DESCRIPTION OF THE INVENTION

On the following pages, the metallization forming method of the present invention is described in detail with reference to the preferred embodiments shown in the accompanying drawings.

Figure 1:
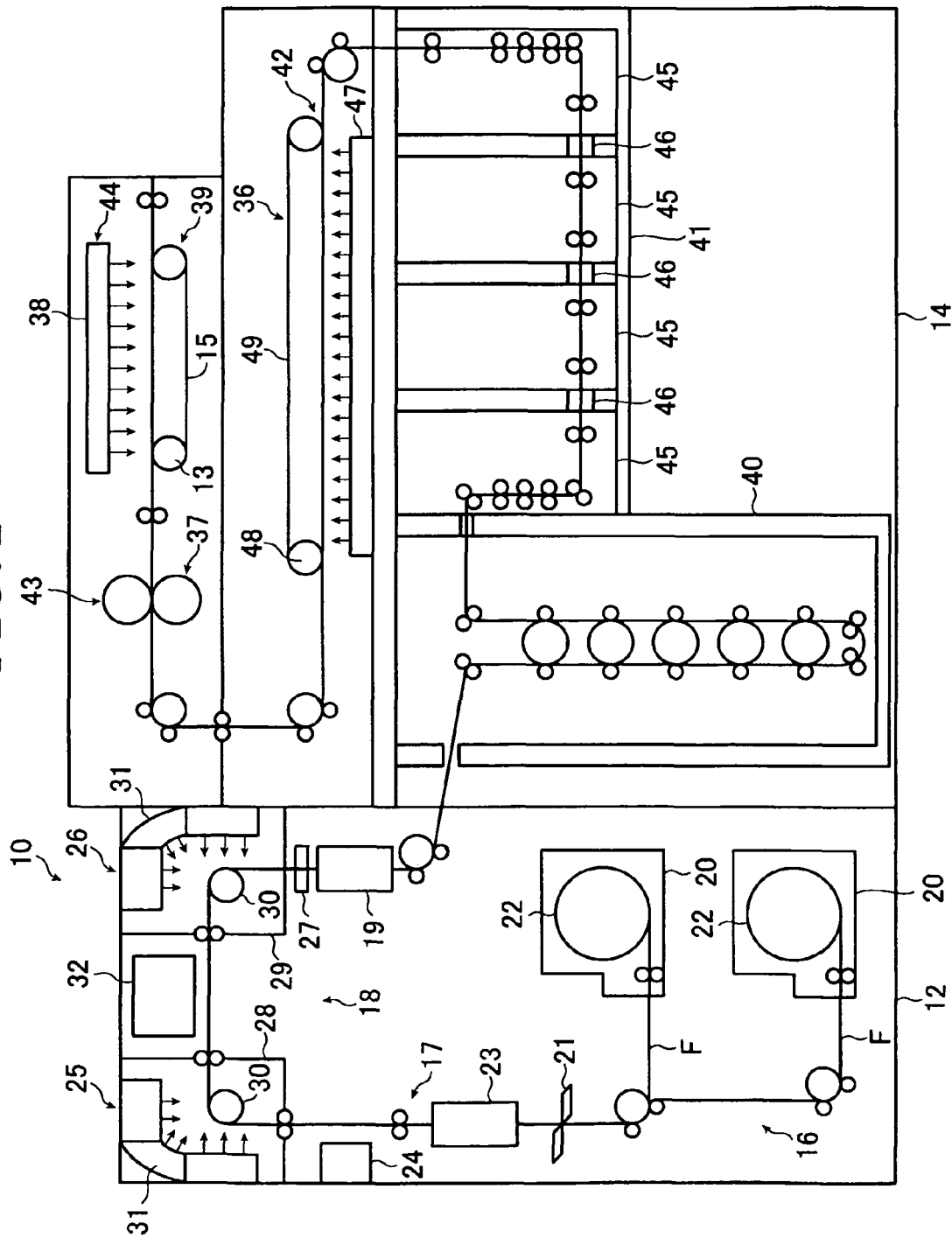
FIG. 1 shows an outline of the structure of an embodiment of a metallization forming apparatus that enables the present invention.

FIG. 1 shows an outline of the structure of an embodiment of a metallization forming apparatus that enables the metallization forming method of the present invention.

The metallization forming apparatus 10 (which is hereinafter sometimes referred to simply as the apparatus 10) is such that in response to the information on a metallization pattern as entered by an image information input means (not shown), a silver halide emulsion is physically patterned on one surface of a film F to form a patterned emulsion layer comprising the silver halide emulsion, and after exposing the thus formed patterned emulsion layer, development processing is performed on the exposed patterned emulsion layer, whereby a patterned conductive silver layer is formed as a metallization pattern.

In the illustrated case, the apparatus 10 comprises a patterning zone 12 and a processor zone 14. Although not explained specifically, the film F is transported to various sites by known transport means such as transport roller pairs.

The patterning zone 12 has a film supply section 16, a subbing section 17, a pattern forming section 18, and an exposing section 19.

The film supply section 16 is a site where the film F is cut to a desired size and then supplied to the pattern forming section 18; in the illustrated case, the film supply section 16 has two magazines 20 and a cutter 21.

The film (substrate or support) F as used in the present invention will be later described in detail.

Each of the magazines 20 accommodates a film roll 22, or a roll of the film F. The film F withdrawn from the magazine 20 is cut to a desired size by the cutter 21 which may be of any known type.

The subbing section 17 is a site where the surface of the film F is subbed before a patterned emulsion layer is formed on it; in the illustrated case, the subbing section 17 has a contact angle adjusting part 23, an adhesive force enhancing part 24, and a drying part 25.

In order to ensure that the precision of the shape of the pattern on the emulsion layer which is to be formed at a later time will not vary on account of the wettability of the surface of the film F, the contact angle adjusting part 23 applies a plasma treatment at one atmosphere to the surface of the film F, thereby adjusting the contact angle on the surface of the film F.

The adhesive force enhancing part 24 forms a subbing coat in order to improve the adhesive force (adhesion) between the film F and a patterned emulsion layer to be formed at a later time.

Here, the adhesive force enhancing part 24 may preferably employ an ink-jet recording apparatus to form the subbing coat in accordance with the shape of the pattern on the patterned emulsion layer to be formed at a later time.

This way of formation, compared to the case of forming a subbing coat on the entire surface of the film F, can save the amount of the material's use and offers a further advantage that reliability in the insulation of the areas where no metallization pattern is formed is maintained at high level.

Details of the subbing coat to be formed will be given later.

The drying part 25 is for drying the subbing coat formed on the surface of the film F and any known means can be employed, provided that it makes no contact with the side of the film F where the emulsion layer is to be patterned (which is hereinafter sometimes referred to simply as the patterning side of the film F).

In the illustrated case, the drying part 25 is composed of a heating roller 30 that is provided to face the reverse side (non-patterning side) of the film F and a warm air heater 31 having warm air nozzles provided to face the patterning side of the film F.

By providing the above-described drying part 25, the heat efficiency at the surface of the film F can be improved without making contact with the subbing coat formed on the surface of the film F and, hence, the formed subbing coat can be dried within a short time.

The pattern forming section 18 is a site at which a silver halide emulsion is patterned on the subbing coat on the film F to form a patterned emulsion layer on the subbing coat and from which the film F is supplied to the exposing section 19; in the illustrated case, the pattern forming section 18 has an ink-jet recording part 32, a drying part 26, heat-insulating/wind-shielding parts 28 and 29, and a protective layer forming part 27.

The ink-jet recording part 32 (which is hereinafter sometimes referred to simply as a recording part 32) is for patterning a silver halide emulsion on the subbing coat formed on the surface of the film F to form a patterned emulsion layer on the subbing coat.

Details of the recording part 32 will be given later.

The drying part 26 is for drying the patterned emulsion layer formed on the surface of the film F and it may be of the same design as the drying part 25.

In the illustrated case, the drying part 26 is the same as the drying part 25 in that it is composed of a heating roller 30 that is provided to face the reverse side (non-patterning side) of the film F and a warm air heater 31 having warm air nozzles provided to face the patterning side of the film F.

By providing the above-described drying part 26, the heat efficiency at the surface of the film F can be improved without making contact with the patterned emulsion layer formed on the surface of the film F and, hence, the formed patterned emulsion layer can be dried within a short time.

The protective layer forming part 27 is intended to form a protective layer made of a binder such as gelatin or a high-molecular weight polymer on the dried patterned emulsion layer in order to protect it against abrasion and improve its mechanical characteristics.

The method of forming the protective layer is not limited in any particular way and it can be formed by any known method. The thickness of the protective layer to be formed is preferably no more than 0.2 μm.

The heat-insulating/wind-shielding parts 28, 29 are for establishing heat insulation and wind shielding between the above-described drying parts 25, 26 and the recording part 32; they ensure that no humid air will flow through the drying part 25 and 26 into that site of the recording part 32 where the emulsion is to be patterned while, at the same time, ensuring that nozzles in the recording part 32 through which an emulsion is ejected (the ejecting nozzles to be described later) will not dry up to become clogged.

Although omitted for the sake of clarity, the pattern forming section 18 is of course equipped with known means that are used to form a pattern on the film F, as exemplified by a wipe, a suction-type maintenance means, an alignment means, and a non-ejection detecting/correcting means.

The exposing section 19 is a site where the patterned emulsion layer as formed in the pattern forming section 18 is irradiated with an electromagnetic radiation such as light (e.g., visible or UV) or X-rays to effect blanket exposure.

The light source for applying the electromagnetic radiation is not limited in any particular way and it may have a wavelength distribution or a specific wavelength value; examples that can be used include a fluorescent lamp, a cold-cathode tube, a UV lamp, a mercury lamp emitting g- or i-line, a laser, and the like.

If the patterning of the emulsion layer involves a pattern that has so high a resolution that it cannot be drawn by the ink-jet recording part 32, scan exposure is preferably performed with a laser that is capable of higher resolution than is achieved by the recording part 32.

Some cold-cathode tubes may optionally use a variety of light emitters that emit in the spectral region, and exemplary light emitters include a red emitter, a green emitter and a blue emitter, that may be used either alone or in combination; the spectral region is in no way limited to the red, green and blue colors and fluorescence emitters may be used that emit in the yellow, orange, violet or infrared region.

If any cold-cathode tube is to be used, one that mixes the above-mentioned light emitters to emit white light is preferred.

If a laser is to be used as the light source, it may be a gas laser, a light emitting diode, or a semiconductor laser. A second harmonic generating light source in which a semiconductor laser, or a solid laser using a semiconductor laser as the exciting light source, is combined with a nonlinear optical crystal, as well as a KrF excimer laser, an ArF excimer laser, and an $F_2$ laser may also be used.

Specific light sources that are preferably used include a blue semiconductor laser at a wavelength of 430-460 nm (reported by Nichia Corporation at the 48th Spring Meeting held by the Japan Society of Applied Physics in March 2001), a green laser of 530 nm which is derived from a semiconductor laser (lasing wavelength: ca. 1060 nm) by wavelength conversion with a SHG crystal of $LiNbO_3$ having an inverted domain structure in the form of a waveguide, a red semiconductor laser at a wavelength of about 685 nm (HITACHI Type No. HL6738MG), and a red semiconductor laser at a wavelength of about 650 nm (HITACHI Type No. HL6501MG).

The above-described cold cathode tube has such advantages as low cost, ease in adjustment of optical axis and color which renders it easy to operate, and adaptability for compact system; the semiconductor laser and the second harmonic generating light source have such advantages as low cost, long life, high stability, and adaptability for compact system; hence, a suitable light source may be chosen depending on the specific object.

In the illustrated apparatus 10, the processor zone 14 has a developing section 40, a washing section 41, a drying section 42, a smoothing section 43, and a vapor contacting section 44.

The developing section 40 is such a site that after the patterning side of the film F is exposed in the exposing section 19, the film F is subjected to development processing to form a patterned conductive silver layer on its surface.

In the present invention, the method of performing development processing is not limited in any particular way and one may apply any of ordinary developing techniques that are used on silver salt photographic films, print paper, films for making printing plates, and emulsion masks for making photomasks.

Developers for use in the development process include lithographic developers such as PQ developer, MQ developer, MAA developer, and D85 (of KODAK's formulary).

Specific examples of developers that can be used include CN-16, CR-56, CP45X, FD-3 and PAPITOL according to FUJIFILM's formulary, as well as C-41, E-6, RA-4, Dsd-19 and D-72 according to KODAK's formulary, plus the developers contained in their kits.

A more specific example is a liter of developer that has 0.037 mol/L of hydroquinone, 0.016 mol/L of N-methylaminophenol, 0.140 mol/L of sodium metaborate, 0.360 mol/L of sodium hydroxide, 0.031 mol/L of sodium bromide, and 0.187 mol/L of potassium metabisulfite added to it.

The washing section 41 is a site where the film F supplied from the exposing section 19 is washed with water in order to improve the conductivity of the patterned conductive silver layer before it is supplied to the drying section 42.

The illustrated washing section 41 is composed of four water-filled wash tanks 45 and a number of roller pairs for transporting the film F; provided in the partition of every two adjacent wash tanks 45 is a liquid-impermeable squeezing part 46 that allows the passage of the film F but blocks the wash water in order to improve the production rate.

In addition, in order to prevent the rollers from being fouled or transferring any dirt to the film F, the washing section 41 has a transport-outside-the-liquid automatic washing means (not shown) for automatically washing the roller pairs situated outside the wash water.

In the present invention, the washing method is not particularly limited and one may apply any common method such as dipping the film F in water that fills the wash tanks 45 and transporting it by roller pairs; in this case, the bath temperature of each wash tank 45 is preferably between 0 and 50° C. and the passage time preferably ranges from 5 seconds to 2 minutes.

The drying section 42 is a site where the surface of the film F which has been washed in the washing section 41, namely the patterning side of the film F, is dried; in the illustrated case, the drying section 42 is composed of a warm air heater 47 and a transport unit 36; the warm air heater 47 has a plurality of warm air nozzles that remove the wash water on the patterning side of the film F to dry it without contacting that patterning side, and the transport unit 36 comprises rollers 48 and an endless belt 49 for transporting the film F.

Using the above-described means which does not contact the patterning side of the film F, the drying section 42 removes the wash water on that patterning side of the film F to thereby prevent adhesion or transfer of the patterned conductive silver layer on the film F.

The smoothing section 43 is a site at which the patterned conductive silver layer on the surface of the film F is smoothed to ensure that more metal particles are allowed to bind together in that patterned conductive silver layer as the film F is supplied from the drying section 42, whereby the patterned conductive silver layer becomes more conductive.

In the present invention, the smoothing method is not particularly limited but a calender roll 37 consisting of a pair of rolls is preferably used.

The smoothing process is preferably conducted at temperatures between 10° C. (without temperature control) and 100° C.; a more preferred temperature, which varies with the linear density and shape of the metallization pattern and the type of the binder, is within the range from about 10° C. (without temperature control) to 50° C.

The calender roll 37 is not limited in any particular way and a roll of plastics such as epoxy, polyimide, polyamide or polyimide amide or a metal roll may be used.

When both sides of the film F have an emulsion layer, it is preferred to use a metal roll pair; when only one side of the film F has an emulsion layer, the combination of a metal roll and a plastic roll is preferred from the viewpoint of preventing wrinkles.

In one example, a metal roll pair is used as the calender roll 37 and the film F is passed through a hydraulically controlled roll nip to carry out smoothing; in another example, both a heating roll and a shoe press roll having a cylindrical plastic jacket that rotates in synchronism with the transport of the film F and a press shoe that is contained in the plastic jacket to extend across the width of the film F are used to smooth the film F by passing it through a shoe press roll nip so that the shoe is depressed against the film F at a specified pressure via the plastic jacket, whereby the film F is smoothed.

To ensure that the surface resistance of the conductive film is adequately reduced, the lower limit of the linear pressure to be applied by the calender roll 37 is at least 980 N/cm (100 kgf/cm), preferably at least 1960 N/cm (200 kgf/cm), and more preferably at least 2940 N/cm (300 kgf/cm).

The upper limit of the linear pressure is preferably not more than 6860 N/cm (700 kgf/cm).

The term "linear pressure (load)" as used herein means that force which is exerted per centimeter of the film sample being compacted.

The vapor contacting section 44 is a site where the patterned conductive silver layer on the film F is contacted by a vapor so that its conductivity is conveniently increased in a short time; in the illustrated case, the vapor contacting section 44 is composed of a vapor generating unit 38 and a transport unit 39; the vapor generating unit 38 has a plurality of vapor nozzles by means of which a vapor is brought into contact with the conductive silver layer of the film F without the contact of the unit 38 with the patterning side of the film F, and the transport unit 39 comprises rollers 13 and an endless belt 15 for transporting the film F.

The temperature of the vapor which is to be brought into contact with the patterned conductive silver layer (film F) is preferably at least 80° C. More preferably, the vapor temperature is at least 100° C. but not more than 140° C. at one atmosphere. The duration of contact with the vapor, which varies with the type of the binder to be used, is preferably from about 10 seconds to about 5 minutes, more preferably from 1 to 5 minutes in the case where the substrate measures 60 cm by 1 m.

Figure 2:
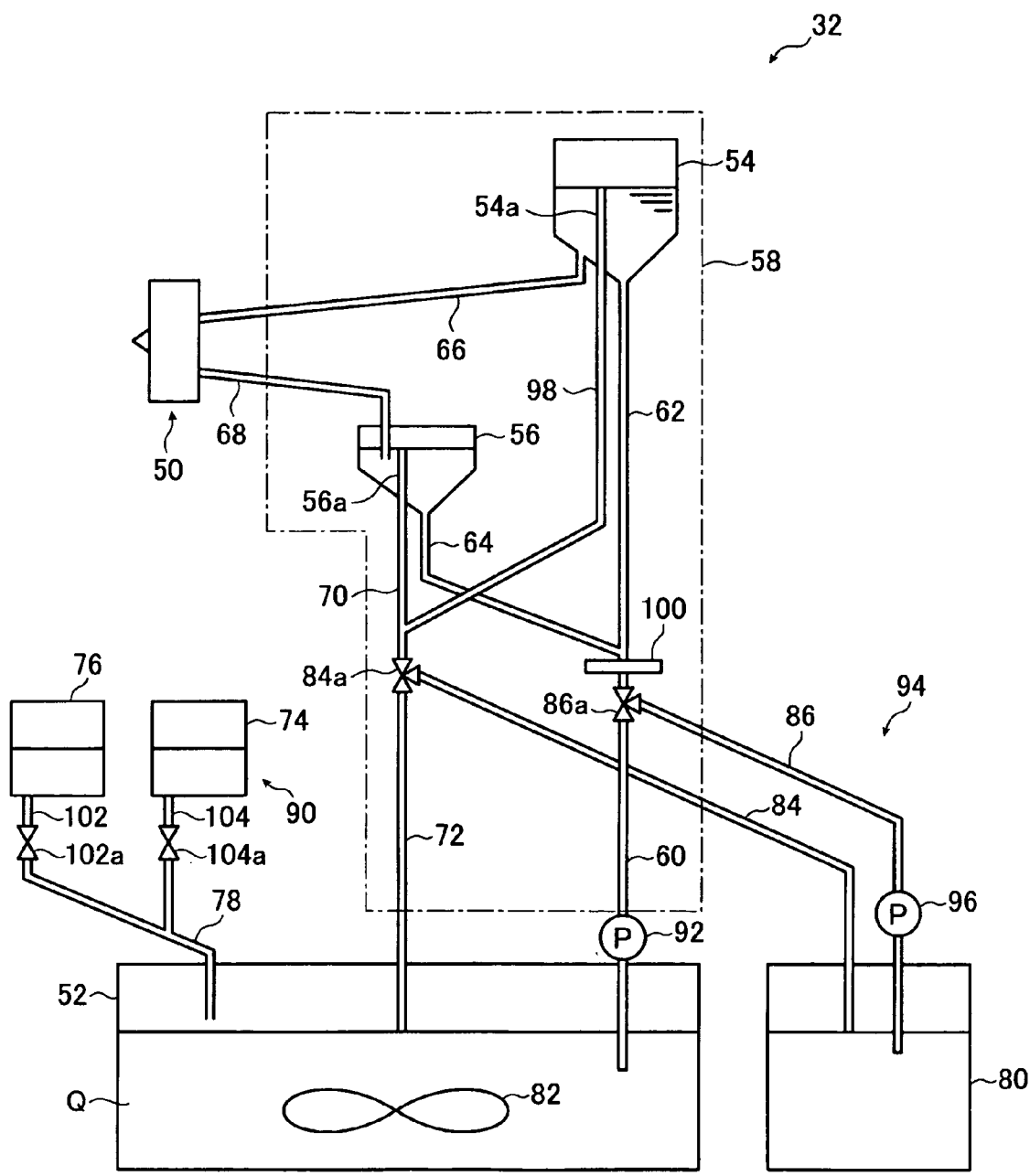
FIG. 2 shows in concept an exemplary ink-jet recording apparatus.

We now describe the ink-jet recording part 32 by referring to FIG. 2, which shows in concept an example of the recording part 32.

The recording part 32 shown in FIG. 2 is a piezoelectric ink-jet recording apparatus that exerts pressure on a silver halide emulsion Q (which is hereinafter sometimes referred to simply as an emulsion Q) to eject it.

The emulsion Q will be described later in detail.

As shown in FIG. 2, the recording part 32 basically comprises a main tank 52, an emulsion-circulating pump 92, a filter 100, an emulsion-circulating pathway 58, an ejecting head (ink-jet head) 50, an emulsion-replenishing unit 90, and a washing unit 94.

In addition to the members shown in FIG. 2, the recording part 32 has a variety of constituents that are common to known piezoelectric ink-jet recording apparatuses.

The main tank 52 is a closed tank that serves as a reservoir of the emulsion that circulates through the emulsion-circulating pathway 58 in the recording part 32. Note that the main tank 52 preferably has the ability to shield from light in order to keep the quality of the emulsion Q.

The illustrated main tank 52 has an agitating means 82 that disturbs the emulsion Q in order to prevent precipitation and accumulation of the emulsion Q so that the quality of the emulsion Q is kept while preventing the clogging of the nozzles on the ejecting head 50. Although not shown, the main tank 52 has a temperature adjusting means for improving the stability of the emulsion Q being ejected and a pressure control means that depends on differential water head or uses a diaphragm for controlling the pressure on the emulsion within the system.

The emulsion-circulating pump 92 has one of its ends connected to a common supply pipe 60 in the emulsion-circulating pathway 58 so that it suctions the emulsion Q within the main tank 52 to supply the emulsion into the emulsion-circulating pathway 58.

Preferably used as the emulsion-circulating pump 92 is a non-self-priming pump which, while in operation, supplies the emulsion Q into the emulsion-circulating pathway 58 and, during shutdown, does not hold the emulsion Q within the emulsion-circulating pathway 58 but allows it to be recovered into the main tank 52 under gravity.

The filter 100 is connected to the emulsion-circulating pump 92 so that it removes any substance of such a size that it may get into the ejecting head 50 and the emulsion-circulating pathway 58 to become considered as foreign matter.

The filter 100 is not limited to any particular type as long as it can remove such substances and will not interfere with smooth circulation of the emulsion, and a mesh filter is preferably used.

The emulsion-circulating pathway 58 is composed of an emulsion supply channel for supplying the emulsion Q from the main tank 52 into the ejecting head 50, and an emulsion recovery channel for recovering the emulsion Q that has not been ejected from the ejecting head 50.

Preferably, the emulsion-circulating pathway 58 should also have the ability to shield from light in order to keep the quality of the emulsion Q.

The emulsion supply channel in the emulsion-circulating pathway 58 is mainly composed of a supply sub-tank 54, the common supply pipe 60 connected to the emulsion-circulating pump 92, a first supply pipe 62 connecting the common supply pipe 60 to the supply sub-tank 54, a second supply pipe 64 connecting the common supply pipe 60 to a recovery sub-tank 56, a third supply pipe 66 connecting the supply sub-tank 54 to the ejecting head 50, and a third recovery pipe 98 for recovering the emulsion Q that overflows an overflow pipe 54a in the supply sub-tank 54.

Speaking of the emulsion recovery channel in the emulsion-circulating pathway 58, it is mainly composed of the recovery sub-tank 56, a first recovery pipe 68 connecting the ejecting head 50 to the recovery sub-tank 56, a second recovery pipe 70 for recovering the emulsion that overflows an overflow pipe 56a in the recovery sub-tank 56, and a common recovery pipe 72 through which the emulsion recovered through the second recovery pipe 70 and the third recovery pipe 98 is recovered into the main tank 52.

The ejecting head 50 in the embodiment under consideration is of a piezoelectric type that has a piezoelectric device which, upon application of a voltage, deforms to exert pressure on the emulsion Q so that it is ejected.

Details of the ejecting head 50 will be given later.

The emulsion-replenishing unit 90 which refills the main tank 52 with the consumed amount of emulsion Q basically has an emulsion-replenishing tank 76, a diluent-replenishing tank 74, as well as replenishing pipes 102, 104, and 78.

The emulsion-replenishing tank 76 is a closed tank that is filled with a concentrated emulsion and is connected to the main tank 52 via the replenishing pipes 102 and 78.

The diluent-replenishing tank 74 is a closed tank that is filled with a liquid carrier used as a diluent for a concentrated emulsion that is used to replenish the emulsion Q; this tank is connected to the main tank 52 via the replenishing pipes 104 and 78.

The replenishing pipes 102 and 104 have replenishment control valves 102a and 104a, respectively, and by opening or closing, as required, these valves 102a and 104a, the main tank 52 is refilled with specified amounts of emulsion and diluent.

The washing unit 94 has a wash fluid supply pipe 86, a wash fluid recovery pipe 84, three-way control valves 86a and 84a, as well as a pump 96 and a wash fluid tank 80.

The wash fluid supply pipe 86 has one of its ends connected to the wash fluid tank 80 and the other end connected to the three-way control valve 86a provided on the common supply pipe 60. The wash fluid supply pipe 86 is provided with the pump 96.

The wash fluid recovery pipe 84 has one of its ends connected to the wash fluid tank 80 and the other end connected to the three-way control valve 84a provided on the common recovery pipe 72.

Let us explain how the emulsion circulating system works when the recording part 32 having the structure described above is in operation (in a recording mode).

First, the emulsion-circulating pump 92 is actuated to pump the emulsion Q from the main tank 52 into the supply sub-tank 54 and the recovery sub-tank 56 through the common supply pipe 60, the first supply pipe 62, and the second supply pipe 64, whereupon the emulsion Q collects in the supply sub-tank 54 and the recovery sub-tank 56.

The emulsion Q collecting in the supply sub-tank 54 flows into the ejecting head 50 through the third supply pipe 66 on account of the head that exists between the supply sub-tank 54 and the ejecting head 50.

On the other hand, that part of the emulsion Q which has not been ejected through the ejecting head 50 is supplied into the recovery sub-tank 56 through the first recovery pipe 68 on account of the head that exists between the ejecting head 50 and the recovery sub-tank 56.

The emulsion Q that overflows the recovery sub-tank 56 is returned into the main tank 52 through the second recovery pipe 70 and the common recovery pipe 72.

This is how the emulsion Q circulates through a path, starting from the main tank 52, flowing through the supply sub-tank 54 and the ejecting head 50, and ending in the recovery sub-tank 56.

Note that the emulsion Q overflowing the supply sub-tank 54 is returned into the main tank 52 through the third recovery pipe 98 and the common recovery pipe 72.

We next explain how the recording part 32 works in a washing mode.

First, the emulsion-circulating pump 92 is stopped, whereupon the emulsion Q in the emulsion-circulating pathway 58 (comprising the supply sub-tank 54, the recovery sub-tank 56, and the pipes that connect them) is recovered into the main tank 52; then, the three-way control valve 86a is switched from the main tank 52 to the wash fluid supply pipe 86, and the three-way control valve 84a is also switched from the main tank 52 to the wash fluid recovery pipe 84.

Subsequently, the pump 96 is actuated so that the wash fluid in the wash fluid tank 80 is circulated through a path, starting from the wash fluid supply pipe 86 and flowing through the supply sub-tank 54, the ejecting head 50, the recovery sub-tank 56, and the pipes that connect them; the wash fluid is then recovered through the wash fluid recovery pipe 84 via the three-way valve 84a, to thereby wash the ejecting head 50 and the emulsion-circulating pathway 58.

By thus washing the interior of the pathway, the emulsion can be prevented more positively from remaining in other areas than in the main tank.

Hence, after the end of an operation using the recording part 32, one may wash the recording part 32 in the manner described above and keep the interior of the recording part 32 (ejecting head 50) in the as-washed state; this is particularly effective in preventing the clogging of the nozzles on the ejecting head 50 which would otherwise occur if gelatin in a highly viscous emulsion remained unremoved.

Next, we explain the ejecting head 50 by referring to FIGS. 3 to 6.

Figure 3:
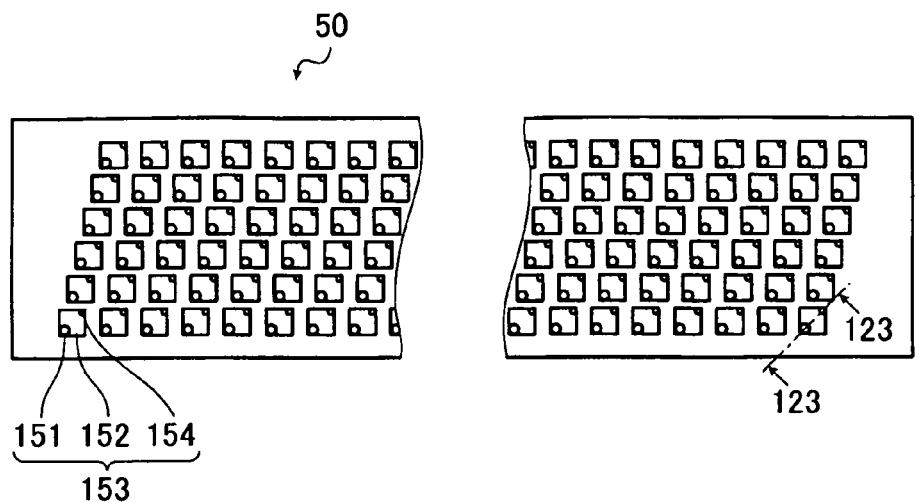
FIG. 3 is a transparent plan view showing an example of the structure of an ejecting head.
Figure 4:
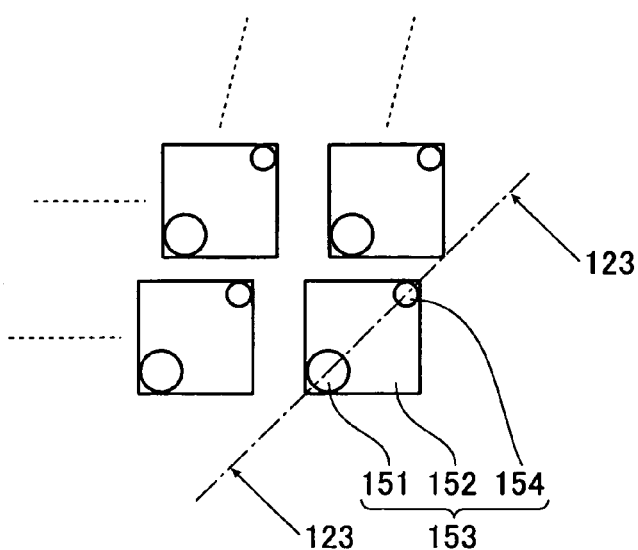
FIG. 4 shows enlarged a part of the ejecting head shown in FIG. 3.

FIG. 3 is a transparent plan view showing an example of the structure of the ejecting head 50, and FIG. 4 shows enlarged a part of this ejecting head.

Figure 5:
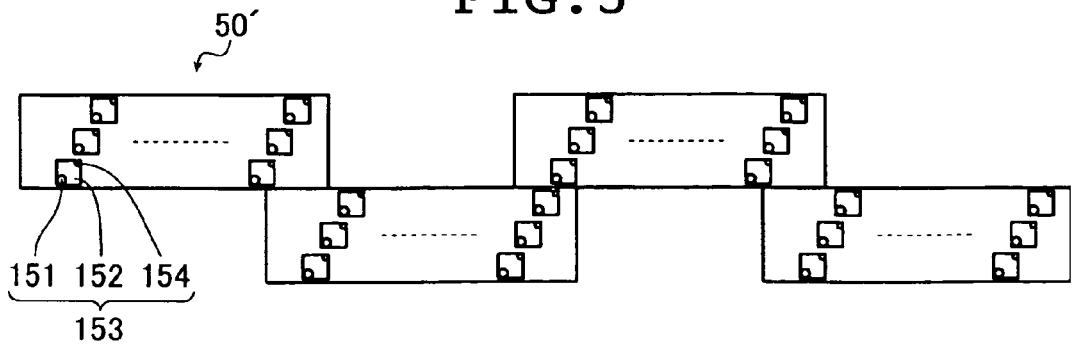
FIG. 5 is a transparent plan view showing another example of the structure of an ejecting head.

FIG. 5 is a transparent plan view showing another example of the structure of the ejecting head 50, and FIG. 6 is a sectional view (taken along line 123-123 in FIG. 3) that shows a 3D structure of a single liquid ejecting element (the unit corresponding to a single nozzle 151).

The ejecting head 50 is a full-line head which, as shown in FIGS. 3 and 4, has such a structure that a plurality of units (liquid droplet ejecting elements) 153, each comprising a nozzle 151 through which the emulsion is ejected, a pressure compartment 152 that corresponds to the nozzle 151, and the like, are arranged staggered in a matrix (two-dimensionally).

The ejecting head 50 having this structure is projected in such a way that the individual units 153 are arranged in the longitudinal direction of the head 50 (which is perpendicular to the film feed direction, and is hereinafter referred to as the perpendicular direction) and, hence, the nozzle interval (projected nozzle pitch) can be substantially reduced.

The ejecting head 50 is by no means limited to the case shown in FIGS. 3 and 4 and, alternatively, short head modules each comprising a two-dimensional array of the nozzles 151 may be arranged in a staggered fashion to be connected together so as to construct a line head 50' as shown in FIG. 5 which has a nozzle train that spans the whole width of the film F in the perpendicular direction.

As shown in FIGS. 3 and 4, the pressure compartment 152 is generally square in its planar shape and has an outlet to the nozzle 151 provided at one of the two corners on the diagonal line, with an ink inlet (supply port) 154 being provided at the other corner.

The shape of the pressure compartment 152 is not particularly limited and its planar shape may be four cornered (e.g., a diamond or rectangle), pentagonal, hexagonal or otherwise polygonal, or it may assume many other shapes including a circle and an ellipse.

As shown in FIG. 6, each pressure compartment 152 communicates with a common channel 155 via the supply port 154.

The common channel 155 communicates with the main tank 52 which is the emulsion supply source, so that the emulsion supplied from the main tank 52 is distributed among the individual compartments 152 via the common channel 155.

The surface of a part of the pressure compartment 152 (the top surface in FIG. 6) is made of a press sheet 156 (a diaphragm that also serves as a common electrode), which is joined to a piezoelectric device 158 having a discrete electrode 157.

When a drive voltage is applied between the discrete electrode 157 and the common electrode, the piezoelectric device 158 deforms and the capacity of the pressure compartment 152 varies to cause a pressure change, whereupon the emulsion Q is ejected through the nozzle 151.

After the ejection of the emulsion, the piezoelectric device 158 returns to its original shape, whereupon a fresh emulsion Q flows through the common channel 155, then through the supply port 154 to be loaded in the pressure compartment 152.

Note that the piezoelectric device 158 is advantageously one that uses a piezoelectric material such as lead zirconate titanate or barium titanate.

On the following pages, the metallization forming method of the present invention is described in detail by referring to FIGS. 7A through 7F so as to explain the action of the metallization forming apparatus 10 having the structure described above.

FIGS. 7A through 7F are a set of diagrams showing an example of the metallization forming method of the present invention.

Reference should first be made to the film supply section 16; the film roll 22 loaded in the magazine 20 is withdrawn from the magazine 20 and cut with the cutter 21 to prepare a desired size of film F, which is then supplied into the subbing section 17.

Subsequently, in the contact angle adjusting part 23 of the subbing section 17, a plasma treatment or the like is performed to adjust the contact angle on the surface of the film F so that the later formed emulsion layer can be patterned with higher precision.

After adjustment of the contact angle on its surface, the film F goes to the adhesive force enhancing part 24 of the subbing section 17 in which in order to improve the adhesive force between the film F and an emulsion layer 164 which is to be formed at a later time, a subbing coat 162 is formed on the surface of the film F by an ink-jet recording method (not shown) in accordance with the pattern of that emulsion layer 164; the film F then enters the drying part 25, where the subbing coat 162 on the film F is dried; the film F is then supplied into the pattern-forming section 18 and, in the ink-jet recording part 32, a silver halide emulsion is patterned on the subbing coat 162 on the film F in accordance with preliminarily entered information about the metallization patterning, to thereby form a patterned emulsion layer 164 that comprises the silver halide emulsion (see FIG. 7A).

As described above, by using the ink-jet recording method to form the subbing coat 162, the material to be used can be saved as compared to the case of forming the subbing coat on the entire surface of the film F, and what is more, reliability in the insulation of the non-patterned areas of the product can be held high.

As a further advantage, by using the ink-jet recording method to form the patterned emulsion layer 164, the emulsion can be used with higher efficiency, which contributes to reducing the running cost. In addition, the drying process can be performed easily. Furthermore, if shuttle scanning is to be used, there is no limitation by the width of the film F and this offers a particular advantage in that the patterned emulsion layer 164 can be formed on an extremely broad film F (substrate).

Use of the ink-jet recording method to form the emulsion layer 164 offers yet another advantage; since the patterned emulsion layer 164 can be formed without contact with the patterning side of the film F, contamination or other fouling can be substantially eliminated and, what is more, the present invention can be applied even if the side of the film F on which the emulsion layer is to be formed has a surface with asperities.

In the pattern forming section 18, after forming the patterned emulsion layer 164 on the subbing coat 162 on the substrate's surface as described above, the film F is sent to the drying part 26, where the side of the film F where the emulsion 164 has been formed, namely, the patterning side of the film F is subjected to a drying process; thereafter, the film F is supplied into the protective layer forming part 27, where a protective layer is formed on the surface of the film F; thereafter, the film F is transported to the exposing section 19.

Subsequently, in the exposing section 19, the patterning side of the film F is subjected to blanket exposure using a fluorescent lamp, a cold-cathode tube or the like (see FIG. 7B).

After performing blanket exposure on the patterning side of the film F in the exposing section 19, the film F is supplied into the developing section 40, where it is subjected to development processing. As a result, a patterned conductive silver layer 168 is formed on the subbing coat 162 on the surface of the film F (see FIG. 7C).

After thus forming the patterned conductive silver layer 168 in the developing section 40, the film F is supplied into the washing section 41.

After performing a washing process on the film F in the washing section 41, the film F is supplied into the drying section 42, where it is subjected to a drying process and then supplied into the smoothing section 43.

Subsequently, in the smoothing section 43, the patterned conductive silver layer 168 on the film F is subjected to a smoothing process (see FIG. 7D) using the calender roll 13 (not shown in FIG. 7D) in order that its conductivity is enhanced.

The smoothing process to be performed in the present invention differs from the aforementioned conventional case (where the substrate's surface on which is formed a layer comprising unexposed areas and conductive silver areas is subjected to a smoothing process) in that the conductive silver layer can be selectively smoothed; thus, pressure can be concentrated in the conductive silver layer, or the patterned areas and, as a result, percent compaction and conductivity are improved very efficiently compared to the case of performing a smoothing process on the substrate's surface having the aforementioned conventional structure.

After thus performing a smoothing process on the conductive silver layer 168 on the film F in the smoothing section 43, the film F is supplied into the vapor contacting section 44, where a vapor contacting process is performed by contacting the patterning side of the film F with a vapor (see FIG. 7E).

After performing a vapor contacting process on the patterning side of the film F in the vapor contacting section 44, the patterned conductive silver layer 168 on the film F is preferably subjected to a plating process in a plating section (not shown) to form a conductive metal layer 170 (see FIG. 7F).

This is how a patterned conductive silver layer, or a metallization pattern is formed on the surface of the film F.

As described above, the metallization forming method of the present invention involves forming an emulsion layer of a silver halide emulsion so as to form a patterned emulsion layer of the silver halide emulsion on the substrate's surface; hence, there is no need to use a film (substrate) that has a coating of emulsion layer applied to its entire surface and the metallization forming method of the present invention can be applied to a great variety of substrates and, in addition, it can be applied to produce double-side boards.

In addition, the patterned emulsion layer is subjected to blanket exposure in one step, so low intensity illuminating light suffices for exposure.

Further, the present invention has no need to use a mask in a patterning process, so the flexibility to meet the on-demand requirement is sufficiently enhanced that the invention can be adapted to quick delivery and small-lot production.

Since no optical patterning is done in the present invention, all processing steps can be performed in a lighted room without any special facilities; this contributes to reducing the production cost.

In addition, the metallization forming method of the present invention differs from the above-described conventional method of forming metallization patterns in that unexposed areas are absent from the emulsion layer and that, therefore, processes such as stabilization that are conventionally performed in order to remove the silver halide in the unexposed areas can be obviated to improve the productivity.

What is more, since unexposed areas are absent from the emulsion layer, no extraneous materials such as gelatin will be left in the unexposed areas, which means there will be no yellowing or other chromatic coloration of the material that remains in the unexposed areas; thus, those areas of the substrate where no metallization is formed have an extremely high transmittance, which makes the metallization forming method of the present invention applicable to the manufacture of plasma display panels (PDPs) and electromagnetic interference shield films.

On the following pages, the film F to be used in the present invention is described in detail.

The film F to be used in the present invention is not limited in any particular way and plastic films, plastic plates, glass plates and the like can be used; starting materials that can be used to make plastic films and plastic plates include: polyesters such as polyethylene terephthalate (PET) and polyethylene naphthalate (PEN); polyolefins such as polyethylene (PE), polypropylene (PP), polystyrene, and EVA; vinyl resins such as polyvinyl chloride and polyvinylidene chloride; as well as polyetheretherketone (PEEK), polysulfone (PSF), polyethersulfone (PES), polycarbonate (PC), polyamide, polyimide (PI), acrylic resins, and triacetylcellulose (TAC).

In the present invention, plastic films and plastic plates can be used in single layers or as multi-layered films comprising two or more layers. If desired, supports with a metal foil such as aluminum foil may also be used.

On the following pages, the subbing coat is described in detail.

The subbing coat is not limited in any particular way and may be exemplified by a binder layer or micro-void type emulsion receptive layer in the absence of any silver halide.

Gelatin is advantageously used as a material that forms the above-mentioned binder layer but other hydrophilic colloids may also be used. Examples include: proteins such as gelatin derivatives, graft polymers of gelatin and other high-molecular weight substances, albumin, and casein; cellulose derivatives such as hydroxyethyl cellulose, carboxymethyl cellulose, and cellulose sulfate esters; sugar derivatives such as sodium alginate and starch derivatives; and a great variety of synthetic hydrophilic high-molecular weight substances such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, or copolymers of monomers that constitute those homopolymers.

Examples of gelatin include not only lime-processed gelatin but also acid-processed gelatin, as well as gelatin hydrolyzates and enzymolyzates.

The thickness of the binder layer ranges preferably from 0.2 to 2 μm, more preferably from 0.5 to 1 μm.

The method of forming the binder layer is not limited in any particular way, either, and an exemplary method comprises coating the surface of the film F with a binder in accordance with the pattern of the emulsion layer and drying the applied coat to harden under a temperature condition of 40 to 100° C. for 0.5 to 5 minutes.

Similarly, the method of forming the micro-void type emulsion receptive layer is not limited in any particular way; in one example, a fluid containing vapor-phase-synthesized silica particles with an average size of no more than 20 nm, a water-soluble resin such as PVA (polyvinyl alcohol) and a water-soluble metal of di- or higher valency is applied to the surface of the film F in accordance with the pattern of an emulsion layer, and simultaneously with this coating step or before the subsequent drying step is conducted, a fluid containing a crosslinker such as boric acid that crosslinks the water-soluble resin is applied in accordance with the pattern of the emulsion layer, followed by drying the applied coat to harden under a temperature condition of 40 to 100° C. for 0.5 to 5 minutes.

Hereinafter, the silver halide emulsion to be used in the present invention is described in detail.

The silver halide emulsion according to the present invention is not limited in any particular way as long as it is a silver halide emulsion containing a silver halide, a binder, a solvent, preferably a dye, an antistatic agent and other additives, and known silver halide emulsions that are produced by known processes may be used.

The viscosity of the silver halide emulsion generally ranges from 1 to 40 mPa·s, preferably from 1 to 30 mPa·s, and more preferably from 1 to 20 mPa·s, at a temperature of 25° C.

The surface tension, whether dynamic or static, of the silver halide emulsion generally ranges from 20 to 100 mN/m, preferably from 20 to 70 mN/m, and more preferably from 20 to 50 mN/m, at a temperature of 25° C.

Viscosity and surface tension may be adjusted by adding a variety of additives including a viscosity adjusting agent, a surface tension adjusting agent, a specific resistance adjusting agent, a film adjusting agent, an UV absorber, an antioxidant, an anti-fading agent, a mold inhibitor, a rust inhibitor, a dispersant, and a surface active agent.

<Silver Halide>

The silver halide to be contained in the silver halide emulsion according to the present invention is not limited in any particular way but silver halides that excel in characteristics as a photosensor are preferred, as exemplified by silver halides having chlorine, bromine, iodine or fluorine, either alone or in combination.

We now describe the silver halide that is preferably used in the present invention.

In the present invention, it is preferred to use silver halides that excel in characteristics as a photosensor, and any of the silver halide-associated techniques that are used in silver salt photographic films, print paper, films for making printing plates, emulsion masks for photomasks, etc. can also be used in the present invention.

The halogen to be contained in those silver halides may be chlorine, bromine, iodine or fluorine, used either alone or in combination. For example, silver halides based on AgCl, AgBr or AgI are preferably used, and silver halides based on AgBr and AgCl are also preferred. Other examples that are preferably used are silver chlorobromide, silver iodochlorobromide, and silver iodobromide. More preferred are silver chlorobromide, silver bromide, silver iodochlorobromide, and silver iodobromide; it is most preferred to use silver chlorobromide or silver iodochlorobromide that each contain 50 mol % or more of silver chloride.

The term "silver halide based on silver bromide (AgBr)" refers to a silver halide in which the molar fraction of bromide ions accounts for 50% or more. The grains of such silver halide based on silver bromide may contain iodide or chloride ions in addition to the bromide ions.

The silver iodide content in the silver halide emulsion is preferably 1.5 mol % per mole of the silver halide emulsion. By adjusting the silver iodide content to be 1.5 mol %, it is possible to prevent fog while providing improved characteristics against pressure. A more preferred silver iodide content is 1 mol % or less per mole of the silver halide emulsion.

The silver halide is in the form of solid grains and from the viewpoint of the image quality of the patterned metallic silver layer that is formed after exposure and development processing, the mean grain size of the silver halide in terms of equivalent spherical diameter ranges preferably from 0.1 to 1,000 nm (1 µm), more preferably from 0.1 to 100 nm, and even more preferably from 1 to 50 nm.

The term "equivalent spherical diameter" of a silver halide grain refers to the diameter of a sphere having an equivalent volume to that grain.

The shape of the silver halide grains is not particularly limited and they may assume various forms including spherical, cubic, tabular (in various planar shapes such as hexagonal, triangular, and four-cornered), octahedral, and tetradecahedral forms, with cubic and tetradecahedral forms being preferred.

The silver halide grains may comprise a uniform phase or different phases in the interior and the surface layer. If desired, the interior or surfaces of the silver halide grains may have local layers having different halogen compositions.

The silver halide emulsion to be used in forming the emulsion layer in the present invention is preferably a monodisperse emulsion, and the coefficient of variation as expressed by {(the standard deviation of grain size)/(mean grain size)}×100 is preferably 20% or less, more preferably 15% or less, and most preferably 10% or less.

The silver halide emulsion to be used in the present invention may be a mixture of two or more silver halide emulsions having different grain sizes.

The silver halide emulsion to be used in the present invention may contain metals of group VIII or VIIB of the periodic table. In particular, for the purpose of achieving high contrast and low fog, it is preferred to contain rhodium compounds, iridium compounds, ruthenium compounds, iron compounds, osmium compounds, or the like. These compounds may have a variety of ligands as exemplified by cyanide ion, halide ion, thiocyanato ion, nitrosyl ion, water, hydroxide ion, and pseudohalogens, as well as organic molecules such as ammonia, amines (e.g., methylamine and ethylenediamine), heterocyclic compounds (e.g., imidazole, thiazole, 5-methylthiazole, and mercaptoimidazole), urea, and thiourea.

For higher sensitivity, doping with metal hexacyanide complexes such as $K_4[Fe(CN)_6]$, $K_4[Ru(CN)_6]$, and $K_3[Cr(CN)_6]$ is advantageously performed.

The above-mentioned rhodium compounds may be water-soluble ones. Exemplary water-soluble rhodium compounds include rhodium(III) halide compounds, hexachlororhodium (III) complex salt, pentachloro-aqua-rhodium complex salt, tetrachloro-diaqua-rhodium complex salt, hexabromorhodium(III) complex salt, hexaaminerhodium(III) complex salt, trioxalatorhodium(III) complex salt, $K_3Rh_2Br_9$, etc.

These rhodium compounds are used as dissolved in water or suitable solvents; if desired, a common method for stabilizing solutions of rhodium compounds may be employed, namely, the addition of an aqueous solution of hydrogen halide (e.g., hydrochloric acid, hydrobromic acid, or hydrofluoric acid) or an alkali halide (e.g., KCl, NaCl, KBr, or NaBr). Instead of using water-soluble rhodium compounds, a silver halide may be prepared by adding the grains of a preliminarily rhodium-doped, different silver halide to dissolve them.

It is also preferred to use silver halides containing Pd(II) ions and/or metallic Pd. Palladium (Pd) may be uniformly distributed within silver halide grains but it is preferably contained in the vicinity of the surface layer of silver halide grains. By the wording Pd is "contained in the vicinity of the surface layer of silver halide grains" is meant that the silver halide grain has a layer within 50 nm deep from the surface that has a higher palladium content than the other layers.

Such silver halide grains can be prepared by adding Pd in the process of their formation and it is preferred to add Pd after adding each of the silver and halide ions in 50% or more of their total additions. It is also preferred to allow the Pd(II) ion to be present in the surface layer of silver halide grains by, for example, adding it during after-ripening.

Such Pd-containing silver halide grains contribute to accelerating physical phenomena or electroless plating, increasing the efficiency of producing a desired electromagnetic shielding material, and reducing the production cost. Palladium (Pd), a well-known catalyst for electroless plating, is extremely expensive but can be saved in the present invention since it can be localized in the surface layer of silver halide grains.

In the present invention, the content of the Pd ion and/or metallic Pd in silver halides ranges preferably from $10^{-4}$ to 0.5 moles per mole of Ag, more preferably from 0.01 to 0.3 moles per mole of Ag. Examples of the Pd compound that can be used include $PdCl_4$ and $Na_2PdCl_4$.

In the present invention, chemical sensitization may or may not be performed as in common silver halide photographic materials. Methods of chemical sensitization are quoted in, for example, paragraphs [0078] onward of JP 2000-275770 A; briefly, chemical sensitizers composed of chalcogenide compounds or noble metal compounds that are capable of increasing the sensitivity of photographic materials are added to silver halide emulsions for chemical sensitization. Silver salt emulsions to be used in the light-sensitive material according to the present invention are preferably ones that have not been subjected to such chemical sensitization, namely, yet to be chemically sensitized emulsions. To prepare the yet to be chemically sensitized emulsions which are preferred in the present invention, the addition of chemical sensitizers that are composed of chalcogenide or noble metal compounds is preferably controlled so that it may not exceed such a value as causes an increase in sensitivity of 0.1 or less. The specific amount of addition of the chalcogenide or noble metal compounds is not limited but in a preferred method of preparing yet to be chemically sensitized emulsions according to the present invention, those chemically sensitizing compounds are preferably added in a total amount that is not more than $5\times10^{-7}$ moles per mole of silver halide.

<Binder>

The binder to be used in the silver halide emulsion according to the present invention is not particularly limited as long as it is capable of uniformly dispersing silver halide grains while assisting in the adhesion of the emulsion layer to the film F; while both a water-insoluble polymer and a water-soluble polymer can be used, the use of water-soluble polymers is preferred.

Specific examples of the binder that can be used include: gelatin, polyvinyl alcohol (PVA), polyvinyl pyrrolidone (PVP), polysaccharides such as starch, cellulose or its derivatives, polyethylene oxide, polyvinylamine, chitosan, polylysine, polyacrylic acid, polyalginic acid, polyhyaluronic acid, carboxycellulose, etc. Depending on the ionicity of functional groups they have, these binders may be neutral, anionic, or cationic. Gelatin may be lime-processed or acid-processed; it is also possible to use gelatin hydrolyzates, gelatin enzymolyzates, or gelatins modified with an amino or a caroboxy group (e.g. phthalated or acetylated gelatin).

The content of the binder in the emulsion layer to be formed of the silver halide emulsion according to the present invention is not particularly limited and can be determined appropriately within a range over which both dispersibility and adhesion can be exhibited. The content of the binder in the emulsion layer is preferably such that the volume ratio of Ag to binder is at least 1:2, more preferably at least 1:1.

<Solvent>

The solvent to be contained in the silver halide emulsion according to the present invention is not particularly limited, either, and examples that can be used include water, aqueous media, organic solvents such as alcohols (e.g. methanol), ketones (e.g. acetone), amides (e.g. formamide), sulfoxides (e.g. dimethyl sulfoxide), esters (e.g. ethyl acetate) and ethers, ionic liquids, and mixtures thereof.

The content of the solvent in the emulsion layer to be formed of the silver halide emulsion according to the present invention generally ranges from 30 to 90 weight %, preferably from 50 to 80 weight %, of the total weight of the silver salt, binder, etc. that are contained in that emulsion layer.

The aqueous media are media based on water and, if desired, mixtures that have water-miscible organic solvents added to water may be used.

Exemplary water-miscible organic solvents include: alcohols (e.g. methanol, ethanol, propanol, isopropanol, butanol, isobutanol, sec-butanol, t-butanol, pentanol, hexanol, cyclohexanol, and benzyl alcohol), polyhydric alcohols (e.g. ethylene glycol, diethylene glycol, triethylene glycol, polyethylene glycol, propylene glycol, dipropylene glycol, polypropylene glycol, butylene glycol, hexane diol, pentane diol, glycerin, hexane triol, and thiodiglycol), glycol derivatives (e.g. ethylene glycol monomethyl ether, ethylene glycol monoethyl ether, ethylene glycol monobutyl ether, diethylene glycol monomethyl ether, diethylene glycol monobutyl ether, propylene glycol monomethyl ether, propylene glycol monobutyl ether, dipropylene glycol monomethyl ether, triethylene glycol monomethyl ether, ethylene glycol diacetate, ethylene glycol monomethyl ether acetate, triethylene glycol monomethyl ether, triethylene glycol monoethyl ether, and ethylene glycol monophenyl ether), amines (e.g. ethanolamine, diethanolamine, triethanolamine, N-methyldiethanolamine, N-ethyldiethanolamine, morpholine, N-ethylmorpholine, ethylenediamine, diethylenetriamine, triethylenetetramine, polyethyleneimine, and tetramethylpropylenediamine), and other polar solvents (e.g. formamide, N,N-dimethylformamide, N,N-dimethylacetamide, dimethyl sulfoxide, sulfolane, 2-pyrrolidone, N-methyl-2-pyrrolidone, N-vinyl-2-pyrrolidone, 2-oxazolidone, 1,3-dimethyl-2-imidazolidinone, acetonitrile, and acetone).

These water-miscible organic solvents may be used in combination of two or more species.

<Dye>

The dye to be contained in the silver halide emulsion according to the present invention is not particularly limited, either, and any known dyes can be used, such as solid disperse dyes that work either as filter dyes or for producing anti-irradiation or various other effects.

Dyes that are preferably used in the present invention include those which are represented by general formulas (FA), (FA1), (FA2), and (FA3) in JP 9-179243 A; specifically, compounds F1 to F34 as mentioned in the document are preferred.

It is also preferable to use any of compounds (II-2) to (II-24), (III-5) to (III-18), and (IV-2) to (IV-7), all mentioned in JP 7-152112 A.

<Antistatic Agent>

The antistatic agent to be contained in the silver halide emulsion according to the present invention is not particularly limited, either, and a layer containing a conductive material that has a surface resistivity of no more than $10^{12}\Omega$ in a 25% RH atmosphere at 25° C. is preferably used, for instance.

The following conductive materials can preferably be used as the antistatic agent in the present invention: the conductive materials described in JP 2-18542 A, page 2, lower left column, line 13 to page 3, upper right column, line 7, specifically, the metal oxides described on page 2, lower right column, lines 2 to 10, and the conductive high-molecular weight compounds P-1 to P-7; and the acicular metal oxides described in U.S. Pat. No. 5,575,957, JP 10-142738 A (paragraphs [0035] to [0043]), and JP 11-223901 A (paragraphs [0013] to [0019]).

The conductive metal oxide particles to be used in the present invention include the particles of ZnO, $TiO_2$, $SnO_2$, $Al_2O_3$, $In_2O_3$, MgO, BaO and $MoO_3$, and composite oxides thereof, as well as metal oxides that comprise the above-listed metal oxides and small amounts of dissimilar atoms. Preferred metal oxides are $SnO_2$, ZnO, $Al_2O_3$, $TiO_2$, $In_2O_3$ and MgO, with $SnO_2$, ZnO, $In_2O_3$ and $TiO_2$ being more preferred, and $SnO_2$ being particularly preferred. Examples that contain small amounts of dissimilar atoms include Al- or In-doped ZnO, Nb- or Ta-doped $TiO_2$, Sn-doped $In_2O_3$, and Sb- or Nb-doped $SnO_2$; the amount of dopants ranges from 0.01 to 30 mol %, preferably from 0.1 to 10 mol %, and $SnO_2$ may alternatively be doped with other dissimilar atoms such as halogens. If the amount of added dopants (dissimilar atoms) is less than 0.01 mol %, it is difficult to impart sufficient conductivity to the oxides or composite oxides; beyond 30 mol %, the blackening of the particles increases and the antistatic layer becomes unsuitably darkened. Therefore, in the present invention, the conductive metal oxide particles are preferably formed of metal oxides or composite metal oxides that contain small amounts of dissimilar atoms. Also preferred are those which contain oxygen defects in the crystal structure.

Preferred as the particles of conductive metal oxides containing small amounts of dissimilar atoms are antimony-doped $SnO_2$ particles, and $SnO_2$ particles doped with 0.2-2.0 mol % of antimony are particularly preferred.

The shape of the conductive metal oxide particles to be used in the present invention is not particularly limited and may be exemplified by grains, needles and the like. The average size of those particles ranges from 0.5 to 25 μm in terms of equivalent spherical diameter.

In order to attain conductivity, soluble salts (e.g. chloride and nitrate), a vapor-deposited metal layer, ionic polymers of the types described in U.S. Pat. No. 2,861,056 and U.S. Pat. No. 3,206,312, insoluble inorganic salts of the types described in U.S. Pat. No. 3,428,451 may be used.

The antistatic layer containing such conductive metal oxide particles is preferably provided as an undercoat on the back surface or as an undercoat for the emulsion layer. The amount of addition of the conductive metal oxide particles is preferably from 0.01 to 1.0 g/m².

The internal resistivity of the light-sensitive material is preferably from $1.0\times10^7$ to $1.0\times10^{12}\Omega$ in a 25% RH atmosphere at 25° C.

In the present invention, even better antistatic quality can be obtained by combining the above-mentioned conductive materials with the fluorine-containing surface active agents described in JP 2-18542 A, page 4, upper right column, line 2 to page 4, lower right column, line 3 from the bottom, and in JP 3-39948 A, page 12, lower left column, line 6 to page 13, lower right column, line 5.

<Other Additives>

The various additives to be contained in the silver halide emulsion according to the present invention are not particularly limited and those which are described in the publications mentioned below can preferably be used.

1) Nucleation Promoter

Exemplary nucleation promoters include the compounds of general formulas (I), (II), (III), (IV), (V) and (VI) that are described in JP 6-82943 A, the compounds of general formulas (II-m) to (II-p) and compounds II-1 to II-22 that are described in JP 2-103536 A, page 9, upper right column, line 13 to page 16, upper left column, line 10, and the compounds described in JP 1-179939 A.

2) Spectral Sensitizing Dye

Exemplary spectral sensitizing dyes include those which are described in JP 2-12236 A, page 8, lower left column, line 13 to lower right column, line 4, in JP 2-103536 A, page 16, lower right column, line 3 to page 17, lower left column, line 20, as well as in JP 1-112235 A, JP 2-124560 A, JP 3-7928 A, and JP 5-11389A.

3) Surface Active Agent

Exemplary surface active agents include those which are described in JP 2-12236 A, page 9, upper right column, line 7 to lower right column, line 7, and in JP 2-18542 A, page 2, lower left column, line 13 to page 4, lower right column, line 18.

4) Antifoggant

Exemplary antifoggants include the thiosulfinic acid compounds that are described in JP 2-103536 A, page 17, lower right column, line 19 to page 18, upper right column, line 4 and page 18, lower right column, lines 1 to 5, and in JP 1-237538 A.

5) Polymer Latex

Exemplary polymer latices include those which are described in JP 2-103536 A, page 18, lower left column, lines 12 to 20.

6) Compound Having an Acid Group

Exemplary compounds having an acid group include the compounds that are described in JP 2-103536 A, page 18, lower right column, line 6 to page 19, upper left column, line 1.

7) Hardening Agent

Exemplary hardening agents include the compounds described in JP 2-103536 A, page 18, upper right column, lines 5 to 17.

8) Black Pepper Preventing Agent

The black pepper preventing agent is a compound that suppresses spots of developed silver from occurring in unexposed areas, and examples include the compounds described in U.S. Pat. No. 4,956,257 and JP 1-118832 A.

9) Redox Compound

Exemplary redox compounds include the compounds represented by general formula (I), in particular, compounds 1 to 50, that are described in JP 2-301743 A, the compounds represented by general formulas (R-1), (R-2) and (R-3), in particular, compounds 1 to 75, that are described in JP 3-174143 A, pages 3 to 20, as well as the compounds described in JP 5-257239 A and JP 4-278939 A.

10) Monomethine Compound

Exemplary monomethine compounds include the compounds of general formula (II), in particular, compounds (II-1) to (II-26), that are described in JP 2-287532 A.

11) Dihydroxybenzenes

Examples include the compounds described in JP 3-39948 A, page 11, upper left column to page 12, lower left column, and in EP 452772A.

12) Anti-Drying Agent

The anti-drying agent is used with advantage to ensure that nozzles used in the ink-jet recording method will not be clogged on account of the drying of the applied material at an ink ejection port.

Preferred anti-drying agents are water-soluble organic solvents having a lower vapor pressure than water. Specific examples include: polyhydric alcohols typified by ethylene glycol, propylene glycol, diethylene glycol, polyethylene glycol, thiodiglycol, dithiodiglylcol, 2-methyl-1,3-propanediol, 1,2,6-hexanetriol, acetylene glycol derivatives, glycerin, and trimethylolpropane; lower alkyl ethers of polyhydric alcohols such as ethylene glycol monomethyl (or ethyl)ether, diethylene glycol monomethyl (or ethyl)ether, and triethylene glycol monoethyl (or butyl)ether; heterocyclic compounds such as 2-pyrrolidone, N-methyl-2-pyrrolidone, 1,3-dimethyl-2-imidazolidinone, and N-ethylmorpholine; sulfur-containing compounds such as sulfolane, dimethyl sulfoxide, and 3-sulfolene; polyfunctional compounds such as diacetone alcohol and diethanolamine; and urea derivatives. Among these compounds, polyhydric alcohols such as glycerin and diethylene glycol are more preferred. These anti-drying agents may be used either alone or in combination of two or more species. These anti-drying agents are preferably contained in ink in amounts of 10 to 50 weight %.

<Penetration Enhancer>

The penetration enhancer is advantageously used to ensure that the ink for ink-jet recording will penetrate paper more efficiently. Exemplary penetration enhancers include alcohols such as ethanol, isopropanol, butanol, di- or triethylene glycol monobutyl ether, and 1,2-hexanediol, as well as sodium lauryl sulfate, sodium oleate, and nonionic surface active agents. These compounds will usually prove adequately effective if they are contained in ink in amounts of 5 to 30 weight % and they are preferably added in amounts within a range over which no ink bleeding or print-through will occur.

<UV Absorber>

The UV absorber is used for the purpose of improving the keeping quality of image. Exemplary UV absorbers that can be used include: the benzotriazole compounds described in JP 58-185677 A, JP 61-190537 A, JP 2-782 A, JP 5-197075 A, JP 9-34057 A, etc.; the benzophenone compounds described in JP 46-2784 A, JP 5-194483 A, U.S. Pat. No. 3,214,463, etc.; the cinnamic acid compounds described in JP 48-30492 B, JP 56-21141 B, JP 10-88106 A, etc.; the triazine compounds described in JP 4-298503 A, JP 8-53427 A, JP 8-239368 A, JP 10-182621 A, JP 8-501291 A, etc.; the compounds described in Research Disclosure No. 24239; and fluorescent whitening agents, or compounds typified by stilbenes or benzoxazoles that absorb UV light to emit fluorescence.

<Anti-Fading Agent>

The anti-fading agent is also used for the purpose of improving the keeping quality of image. Such anti-fading agents may be organic or based on metal complexes. Organic anti-fading agents include hydroquinones, alkoxyphenols, dialkoxyphenols, phenols, anilines, amines, indanes, chromans, alkoxyanilines, heterocyclic compounds, etc., and anti-fading agents based on metal complexes include nickel complexes and zinc complexes. More specifically, one can use the compounds described in Research Disclosure No. 17643 under VII-I to VII-J, Research Disclosure No. 15162, Research Disclosure No. 18716, page 650, left column, Research Disclosure No. 36544, page 527, and Research Disclosure No. 307105, page 872, as well as the compounds described in the patents quoted in Research Disclosure No. 15162 and the compounds that are embraced by the general formulas for typical compounds and the specific compounds that are described in JP 62-215272 A, pages 127-137.

<Mold Inhibitor>

Exemplary mold inhibitors include sodium dehydroacetate, sodium benzoate, sodium pyridinethion-1-oxide, ethyl p-hydroxybenzoate ester, 1,2-benzoisothiazolin-3-one, and salts thereof. These compounds are preferably used in ink in amounts of 0.02 to 1.00 weight %.

<pH Modifier>

The aforementioned neutralizing agents (organic bases and inorganic alkalines) can be used as the pH modifier. For the purpose of improving the storage stability of the ink for ink-jet recording, the pH modifier is preferably added to the ink so as to allow it to have a pH of 6 to 10, more preferably a pH of 7 to 10.

<Surface Tension Modifier>

Surface tension modifiers that can be used in the present invention may be nonionic, cationic, or anionic surface active agents. Preferred surface active agents are anionic ones such as fatty acid salts, alkyl sulfate ester salts, alkylbenzenesulfonic acid salts, alkylnaphthalenesulfonic acid salts, dialkylsulfosuccinic acid salts, alkyl phosphate ester salts, naphthalenesulfonic acid formaldehyde condensation products, and polyoxyethylene alkyl sulfate ester salts; and non-ionic surface active agents such as polyoxyethylene alkyl ethers, polyoxyethylene alkylallyl ethers, polyoxyethylene fatty acid esters, sorbitan fatty acid esters, polyoxyethylene sorbitan fatty acid esters, polyoxyethylene alkylamines, glycerin fatty acid esters, and oxyethylene oxypropylene block copolymers. SURFYNOLS (Air Products & Chemicals, Inc.), which is an acetylene-based polyoxyethylene oxide surface active agent, is also used with preference. Also preferred are amphoteric surface active agents of an amine oxide type, as exemplified by N,N-dimethyl-N-alkylamine oxides. The compounds that are listed as surface active agents in JP 59-157636 A, pages 37-38 and in Research Disclosure No. 308119 (1989) can also be used.

<Antifoaming Agent>

Antifoaming agents such as fluorine- and silicone-containing compounds as well as chelating agents typified by EDTA can also be used depending on the need.

<High-Boiling Point Solvent>

High-boiling point solvents that can be used are the additives that are described in JP 2004-75742 A under paragraphs 0114 and 0115.

Figure 8:
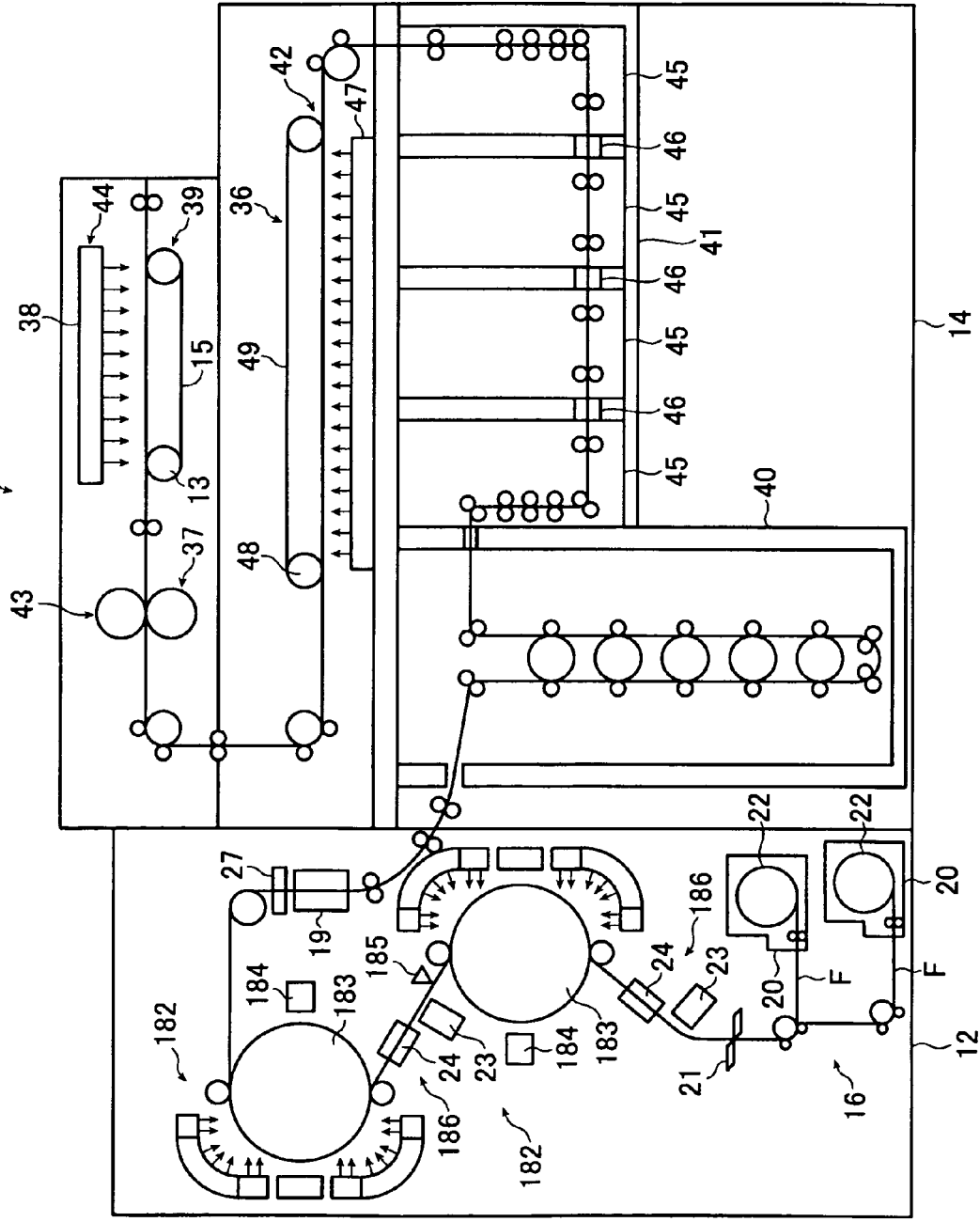
FIG. 8 shows an outline of the structure of another embodiment of the metallization forming apparatus that enables the present invention.

In the present invention, the metallization forming apparatus that enables the metallization forming method of the present invention is in way limited to the apparatus shown in FIG. 1 which patterns an emulsion layer on the surface of one side of film F to form a patterned conductive silver layer and this may be replaced by the apparatus shown in FIG. 8 that patterns an emulsion layer on both sides of film F to form a patterned conductive silver layer.

The metallization forming apparatus generally indicated by 180 in FIG. 8 (which is hereinafter sometimes referred to simply as the apparatus 180) has the same members and means as the metallization forming apparatus 10 shown in FIG. 1, except that it has two subbing sections 186 and two pattern forming sections 182 to pattern an emulsion layer on both sides of film F, that it has a position-detecting unit 185 between the two pattern forming sections 182, and that each pattern forming section 182 has a heating roller 183 and a roll cleaning unit 184. Therefore, on the following pages, description is made of only the heating roller 183, the roll cleaning unit 184, and the position-detecting unit 185.

The heating roller 183 transports the film F as it heats the latter, and the roll cleaning unit 184 cleans the surface of the heating roller 183 to remove any deposit. Any known means may be used as each of the heating roller 183 and the roll cleaning unit 184.

The position-detecting unit 185 detects the position of the pattern on the obverse side of the film F to ensure that the pattern on its reverse side can be formed in registry with the pattern on the obverse side, and any known position-detecting means may be adopted.

The apparatus 180 having the above-described structure is operated as follows: first, as in the apparatus 10, film F is withdrawn from the film supply section 16 and supplied into the subbing section 186 which is upstream of the other subbing section and after a subbing coat is formed with the contact angle on the obverse side of the film F being adjusted, the film F is supplied into the pattern forming section 182 which is upstream of the other pattern forming section and a patterned emulsion layer is formed on the subbing coat on the obverse side of the film F. Subsequently, the film F is supplied into the downstream subbing section 186 and after a subbing coat is formed with the contact angle on the reverse side of the film F being adjusted, the film F is supplied into the downstream pattern forming section 182 and a patterned emulsion layer is formed on the subbing coat on the reverse side of the film F.

Having thus formed a patterned emulsion layer on both sides of the film F, the apparatus 180 having the structure described above performs the same processing as does the apparatus 10 to form a metallization pattern on both sides of the film F.

Since the patterned emulsion layer is already formed on both sides of the film F, the apparatus 180 can expose the two sides of the film F simultaneously and this contributes to a very high efficiency.

The film transport means that can be used in the apparatuses 10 and 180 is not particularly limited but transport means that is to transport the film F having the patterned emulsion layer formed with a moisture content of 20% or more, preferably 2% or more, should not contact the patterned region of the film F; to this end, known transport means such as nip rollers are preferably provided at opposite ends of the film F in the direction of its width.

The reason why the transport means that is to transport the film F having the patterned emulsion layer formed with a moisture content of 20% or more is preferably provided in such a manner that it will not contact the patterned region of the film F is that the emulsion layer with a moisture content of 20% or more is highly fluid and will readily transfer to the transport means such as rollers, whereupon the pattern of the emulsion layer becomes deformed.

Even in the case of transporting the film F having the emulsion layer formed with a moisture content of 2% or more, the transport means is preferably provided in the manner described above and the reason is as follows: the emulsion layer with a moisture content of 2% or more but less than 20% is less fluid but, on the other hand, it becomes sufficiently sticky that it will detach from the film F and adhere to the transport means such as rollers; what is more, the adhering emulsion layer will dry up to solidify and may damage or foul the patterning side of all films F being processed.

Since various troubles can occur if the emulsion layer deposits on the transport means, the apparatuses 10 and 180 preferably have a cleaning means by which the transport means, particularly the one that is located in such a position that the emulsion layer is most likely to deposit, can be cleaned automatically.

The washing section 41 in the apparatus 10 or 180 is not limited to the previously described embodiment but it may be adapted to operate by applying a multi-stage (e.g. two- or three-stage) countercurrent system. If the multi-stage countercurrent system is applied to the present invention, the developed film F is processed with a processing solution which gradually becomes normal, that is to say, processed by moving it in a processing solution through the portions thereof which are successively less contaminated with the developer, and this contributes to an even more efficient washing.

If the above-described multi-stage countercurrent system is to be adopted, washing or stabilization is preferably performed with the amount of wash water being held at 20 L or less and the amount of replenishment at 3 L or less (including zero liters as in the case of washing in stocked water) per square meter of film F. Not only does this enable washing with a smaller amount of water but it also obviates the piping for replenishing wash water in an automatic processor.

If washing is to be done using a small amount of water, the washing section 41 preferably has squeeze rollers and crossover rollers of the types described in JP 63-18350 A, JP 62-287252 A, etc.

In order to prevent uneven processing due to the bubbles that are likely to occur when washing is performed with a small amount of water and/or to ensure that the components of the processing agents that have deposited on the squeeze rollers will not transfer to the processed film, the washing section 41 may use wash water containing a water-soluble surface active agent or an antifoaming agent; alternatively, in order to reduce the pollution impact that becomes a problem when washing is performed with a small amount of water, the washing section 41 may use wash water containing various oxidizing agents or may even be equipped with a filtering means.

Further, in order to prevent contamination due to dyes that have dissolved out of the film F having reduced silver, the dye adsorbent described in JP 63-163456 A may be installed within the wash tanks in the washing section 41.

In the embodiments described above, the film F is subjected to a washing process in the washing section 41 but this is not the sole case of the present invention and not only washing but also stabilization may be performed in order to stabilize the state of the film F.

If stabilization is to be performed, wash water containing one or more of the compounds described in JP 2-201357 A, JP 2-132435 A, JP 1-102553 A and JP 46-44446 A may be used in the final wash tank.

In this case, one may use wash water that optionally contains an ammonium compound, a metal (e.g. Bi or Al) compound, a fluorescent whitening agent, a variety of chelating agents, a film pH modifier, a hardening agent, a bactericide, a mold inhibitor, an alkanolamine or a surface active agent.

Wash water that is preferably used is not only tap water but also deionized water and water that has been sterilized with a halogen or UV bactericidal lamp, a variety of oxidizing agents (e.g. ozone, hydrogen peroxide, and chlorates), and the like.

It is also possible to use wash water that contains one or more of the compounds described in JP 4-39652 A and JP 5-241309 A.

In the embodiments described above, the piezoelectric ejecting head 50 having a piezoelectric device is used since it is capable of precise control over the emulsion, features high reliability for the emulsion, and has high durability; however, this is not the sole case of the present invention and various types of ink-jet head may be employed, including an electrostatic ink-jet head, a thermal ink-jet head, and an ink-jet head of such a type that the diaphragm in an emulsion compartment is vibrated by a micro-machine or the like to eject the emulsion.

In the embodiments described above, the piezoelectric device 158 is deformed to eject the emulsion but this is not the sole mechanism that can be adopted in the present invention and various other systems may be applied, for example, the actuator of the piezoelectric device 158 is deformed to eject the emulsion, or the ink is heated by a heating element such as an electric heater to generate air bubbles whose pressure is used to cause an ink droplet to fly on a trajectory (i.e., a thermal jet method).

In the embodiments described above, the film F is cut to a predetermined size before a metallization pattern is formed but this is not the sole case of the present invention and a metallization pattern may be formed on the film F as it is simply unwound from a roll.

In the embodiments described above, the ejecting head 50 is not shielded from light but in order to maintain the quality of the emulsion within the ejecting head 50, it is preferred to use a light shielding means that shields at least the neighborhood of the ejecting head 50 from light.

In the embodiments described above, the full-line ejecting head 50 is used to pattern the emulsion layer but this is not the sole case of the present invention and the emulsion layer may be patterned by using a shuttle scanning system or a single pass system; alternatively, scanning may be performed in two directions, one being in the transport direction and the other being perpendicular to it, for either system; in yet another version, the film F may be moved in the above-defined two directions to pattern the emulsion layer.

In the embodiments described above, a patterned emulsion layer is formed on the surface of the film F and then dried before exposure is performed; however, this is not the sole case of the present invention and exposure may be performed after the patterned emulsion layer is formed and before it is dried.

In the embodiments described above, the entire surface of the film F is uniformly exposed in the exposing section 19 but this is not the sole case of the present invention and portions of the film F may be successively exposed.

However, uniform exposure is preferred because it allows faster processing and enables exposure to be performed with low illumination intensity, which contributes to higher productivity.

In the embodiments described above, washing (with optional stabilization) is performed after the film F is subjected to development processing; however, this is not the sole case of the present invention and development processing may be followed by a fixing process which is performed by removing the silver salt in the unexposed areas for the purpose of stabilization.

The fixing process is not particularly limited and one may employ the fixing techniques applied to silver salt photographic films, print paper, films for making printing plates, emulsion masks for making photomasks, and the like.

It should, however, be noted that in the present invention where the entire surface of the emulsion layer is exposed, unexposed areas are practically absent, so satisfactory results are obtained without performing the fixing process.

If the fixing process is to be performed, the washing section 41 may be so adapted that water treated by a mold inhibiting means is supplied into the wash tanks 45 in amounts that depend on the progress of the processing and by so doing, part or all of the liquid overflowing the wash tanks 45 can be utilized as the processing solution for the fixing process as described in JP 60-235133 A.

In the embodiments described above, washing is performed after the film F is subjected to development processing; however, this is not the sole case of the present invention and development processing may be followed by oxidation treatment of the metallic silver areas of the film F.

The oxidation treatment is not particularly limited and can be performed by known methods using various oxidizers, as exemplified by treatment with the $Fe^{III}$ ion.

In the embodiments described above, washing is performed after the film F is subjected to development processing; however, this is not the sole case of the present invention and development processing may be followed by reduction treatment in which the film F is immersed in a reducing aqueous solution for providing higher conductivity.

The reducing aqueous solution is not limited to any particular types and one may use an aqueous solution of sodium sulfite, an aqueous solution of hydroquinone, an aqueous solution of paraphenylenediamine, an aqueous solution of oxalic acid, and the like; it is more preferred to adjust the pH of the reducing aqueous solution to 10 or more.

In the embodiments described above, the film F is subjected to a vapor contacting treatment after it is smoothed but this is not the sole case of the present invention and the smoothing treatment may be performed after the vapor contacting treatment. It should, however, be noted that performing the vapor contacting treatment after the smoothing treatment is more effective in providing higher conductivity because the conductive particles bound together can be fused while remaining conductive by exposure to the vapor bath.

In the embodiments described above, the developed film F is subjected to washing and drying in that order; however, this is not the sole case of the present invention and the washing after the development processing may be followed by a plating process in which fine conductive particles are deposited on the conductive silver layer on the surface of the film F to form a plating (conductive metal part).

By thus plating the conductive silver layer, higher conductivity is attained and the fabricated product can be packaged more efficiently.

The plating process can be performed by applying any known electroless plating techniques. The conductive metal part formed by plating preferably contains at least 50 weight %, more preferably at least 60 weight %, of silver with respect to the total weight of the metal in the conductive metal part.

In is also preferred for the present invention that after plating, smoothing or vapor contacting, the surface of the patterned conductive silver layer on the film F is covered with a solder resist.

In the embodiments described above, washing is performed after the surface of the film F is subjected to development processing but this is not the sole case of the present invention and washing may be performed again after the vapor contacting treatment.

By so doing, the binder that has been dissolved or embrittled by the vapor can be washed away, whereby the resistance value of the conductive silver layer can be further reduced.

In the embodiments described above, the ink-jet recording apparatus is used to form the subbing coat in accordance with the shape of the pattern of the emulsion layer to be formed later; however, this is not the sole case of the present invention and the subbing coat may be applied uniformly to the entire surface of the film F by a known method.

It should, however, be mentioned that in order to save the material to be used and to improve the insulating property of the areas where no patterned emulsion layer exists, it is preferred to form the subbing coat in accordance with the pattern of the emulsion layer.

In the embodiments described above, the emulsion layer is patterned on the surface of the film F by the ink-jet recording method (ink-jet printing) in the ink-jet recording part 32; however, this is not the sole case of the present invention and other methods such as gravure printing, offset printing and screen printing may be employed to pattern the emulsion layer on the surface of the film F.

While the metallization forming method of the present invention has been described above in detail, the invention is by no means limited to the foregoing embodiments and it should be understood that various improvements and modifications are possible without departing from the scope and spirit of the invention.

On the following pages, a specific example of the present invention is given to explain the present invention in greater detail.

It should be noted that the materials, amounts of use, proportions, treatments, treatment procedures, and other information that are given in the following Example can be altered as appropriate unless departure from the scope and spirit of the present invention is made. Therefore, the scope of the present invention should not be construed as being limited by the following specific example.

Example

Preparation of an Emulsion

To fluid 1 (see below) held at 38° C. and pH 4.5, fluids 2 and 3 (also see below) were added simultaneously under agitation in amounts that were equivalent to 90% of their feeds over a period of 20 minutes to form core grains of 0.16 μm. Subsequently, fluids 4 and 5 (see below) were added over a period of 8 minutes and the remaining 10% of each of fluids 2 and 3 was then added over a period of 2 minutes, whereupon the grains grew to a size of 0.21 μm. Potassium iodide (0.15 g) was further added and ripening was conducted for 5 minutes to complete the formation of grains.

| Fluid 1 | |
| --- | --- |
| Water | 750 mL |
| Gelatin (phthalated) | 3 g |
| Sodium chloride | 3 g |
| 1,3-Dimethylimidazolidine-2-thione | 20 mg |
| Sodium benzenethiosulfonate | 10 mg |
| Citric acid | 0.7 g |

| Fluid 2 | |
| --- | --- |
| Water | 300 mL |
| Silver nitrate | 150 g |

| Fluid 3 | |
| --- | --- |
| Water | 300 mL |
| Sodium chloride | 38 g |
| Potassium bromide | 32 g |
| Potassium hexachloroiridate(III) (0.005% in a 20% aqueous solution of KCl) | 5 mL |
| Ammonium hexachlororhodate (0.001% in a 20% aqueous solution of NaCl) | 7 mL |

The potassium hexachloroiridate(III) (0.005% in a 20% aqueous solution of KCl) and ammonium hexachlororhodate (0.001% in a 20% aqueous solution of NaCl) that were to be used in fluid 3 had been prepared by dissolving the bulk powders in 20% aqueous solution of KCl and 20% aqueous solution of NaCl, respectively, and heating the resulting solutions at 40° C. for 120 minutes.

| Fluid 4 | |
| --- | --- |
| Water | 100 mL |
| Silver nitrate | 50 g |

| Fluid 5 | |
| --- | --- |
| Water | 100 mL |
| Sodium chloride | 13 g |
| Potassium bromide | 11 g |
| Potassium hexacyanoferrate(II) trihydrate | 5 mg |

Thereafter, washing was performed by the flocculation method according to the usual manner. Specifically, the temperature was lowered to 35° C. and sulfuric acid was added to lower the pH until a silver halide precipitated (pH=3.6±0.2). Then, about 3 L of the supernatant was removed (first wash). After adding 3 L of distilled water, sulfuric acid was added until a silver halide precipitated. Again, 3 L of the supernatant was removed (second wash). The same operation as the second wash was repeated once more (third wash) to complete the washing and desalting steps. The thus washed and desalted emulsion was adjusted to pH 6.4 and pAg 7.5, and sodium benzenethiosulfonate (10 mg), sodium benzenethiosulfinate (3 mg), sodium thiosulfate (15 mg) and chloroauric acid (10 mg) were added and chemical sensitization was performed at 55° C. to attain an optimum sensitivity; thereafter, the stabilizer 1,3,3a,7-tetraazaindene and the antiseptic PROXEL (trade name; product of ICI Co., Ltd.) were each added in an amount of 100 mg.

The eventually prepared emulsion comprised cubic silver iodochlorobromide grains containing 70 mol % of silver chloride and 0.08 mol % of silver iodide and having a mean grain size of 0.22 μm and a variation coefficient of 9%.

This emulsion had the following characteristics: pH=6.4; pAg=7.5; conductivity=4000 pS/m; viscosity=10 mPa·s; surface tension=30 mN/m.

The emulsion was then passed through a filter to remove any foreign matter. The thus refined emulsion was loaded in a piezoelectric ink-jet head from which it was ejected against five sheets of polyimide film F to form a patterned emulsion layer, thereby preparing five samples.

The patterned emulsion layer had a silver-to-binder volume ratio of 4:1.

Subsequently, each of the five samples was developed with a developer of the following formula as it was adjusted to pH 10.5.

[Formula of Developer]

One liter of the developer contained the following compounds.

| | |
| --- | --- |
| Hydroquinone | 15 g/L |
| Sodium sulfite | 30 g/L |
| Potassium carbonate | 40 g/L |
| Ethylenediaminetetraacetic acid | 2 g/L |
| Potassium bromide | 3 g/L |
| Polyethylene glycol 2000 | 1 g/L |
| Potassium hydroxide | 4 g/L |

(Calendering)

The thus developed samples were passed through a calender roll consisting of two rollers each having a diameter of 250 mm and being made of an iron core subjected to a hard chrome plating; calendering was performed at five different linear pressures, 1960 N/cm (200 kgf/cm), 2940 N/cm (300 kgf/cm), 3920 N/cm (400 kgf/cm), 5880 N/cm (600 kgf/cm), and 6860 N/cm (700 kgf/cm).

(Washing and Vapor Contacting)

After calendering, the five samples were dipped in hot water (90° C.) for about 5 minutes and then exposed to 90° C. steam for about 3 minutes.

To evaluate the surface resistance (Ω/sq.) of each sample, two measurements were conducted with a series 4-pin probe (ASP) of LORESTA GP (Model MCP-T610) manufactured by DIA Instruments Co., Ltd. The results are shown in FIG. 9 as a graph illustrating the relationship between the linear pressure applied to the sample and its surface resistance.

Figure 9:
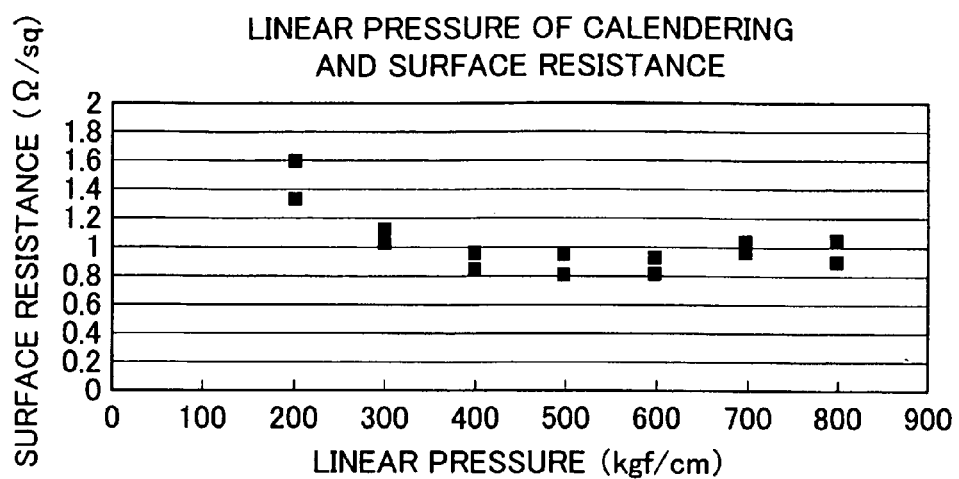
FIG. 9 is a graph showing the relationship between the linear pressure applied in a smoothing process and the resistance value of a conductive silver layer.
Figure 10A:
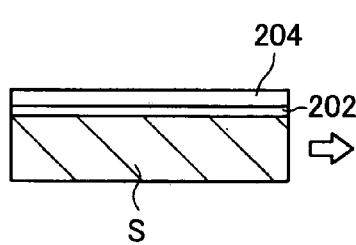
FIGS. 10A through 10F show an example of the conventional metallization forming method in a stepwise manner.
Figure 10B:
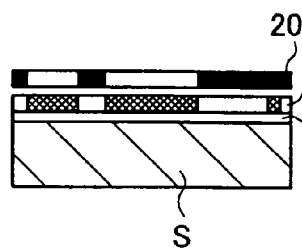
Figure 10C:
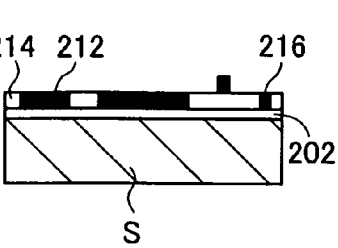
Figure 10D:
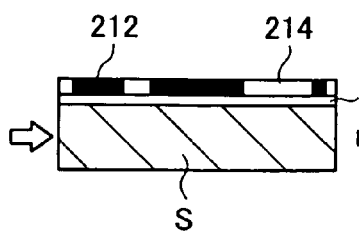
Figure 10E:
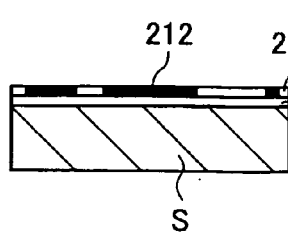
Figure 10F:
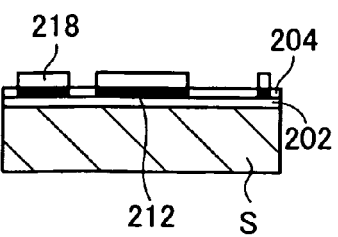

As is clear from the graph of FIG. 9, when 1960 N/cm (200 kgf/cm) and more was applied as a linear pressure for calendering (smoothing), the samples had surface resistances of no more than 1.8 Ω/sq. It was also clear that when the applied linear pressure exceeded 6860 N/cm (700 kgf/cm), the surface resistance of the samples increased slightly. It was therefore evident that the upper limit of the linear pressure to be applied to the samples is preferably 6860 N/cm (700 kgf/cm). The linear pressure is defined as the force that is exerted per centimeter of the sample being compacted.

What is claimed is:

1. A metallization forming method comprising the steps of:
   supplying a silver halide emulsion on a surface of at least one side of a substrate by using one of gravure printing, offset printing, screen printing or ink-jet printing in accordance with a desired metallization pattern to form a patterned emulsion layer;
   subjecting the patterned emulsion layer to blanket exposure in one step; and thereafter
   developing the exposed patterned emulsion layer to form a patterned conductive silver layer having the metallization pattern.

2. The metallization forming method according to claim 1, wherein the ink-jet printing is performed with an ink-jet recording apparatus having a piezoelectric device.

3. The metallization forming method according to claim 1, wherein after forming the patterned conductive silver layer, at least one treatment selected from the group consisting of a smoothing treatment, a vapor contacting treatment and a washing treatment is performed on the patterned conductive silver layer.

4. The metallization forming method according to claim 1, wherein before forming the patterned emulsion layer, the surface of the substrate is subjected to a subbing treatment.

5. The metallization forming method according to claim 4, wherein the subbing treatment is one of a treatment for adjustment of a contact angle on the surface of the substrate and a treatment for enhancement of an adhesive force between the substrate and the patterned emulsion layer.

6. The metallization forming method according to claim 5, wherein the treatment for enhancement of the adhesive force between the substrate and the patterned emulsion layer involves forming a subbing coat on the surface of the substrate in accordance with the shape of the pattern on the patterned emulsion layer.

7. The metallization forming method according to claim 6, wherein the subbing coat is formed using an ink-jet recording apparatus.

8. The metallization forming method according to claim 1, wherein the silver halide emulsion to be patterned has a viscosity of from 1 mPa·s to 40 mPa·s under a 25° C. condition and a surface tension of from 20 mN/m to 100 mN/m under a 25° C. condition.

9. The metallization forming method according to claim 1, further comprising the step of drying the patterned emulsion layer.

10. The metallization forming method according to claim 1, further comprising the step of forming a protective layer on the patterned emulsion layer.

\* \* \* \* \*